(12) United States Patent
van Schravendijk

(10) Patent No.: US 10,316,409 B2
(45) Date of Patent: Jun. 11, 2019

(54) RADICAL SOURCE DESIGN FOR REMOTE PLASMA ATOMIC LAYER DEPOSITION

(71) Applicant: Novellus Systems, Inc., Fremont, CA (US)

(72) Inventor: Bart J. van Schravendijk, Sunnyvale, CA (US)

(73) Assignee: Novellus Systems, Inc., Fremont, CA (US)

( * ) Notice: Subject to any disclaimer, the term of this patent is extended or adjusted under 35 U.S.C. 154(b) by 623 days.

(21) Appl. No.: 13/842,054

(22) Filed: Mar. 15, 2013

(65) Prior Publication Data

US 2014/0179114 A1    Jun. 26, 2014

Related U.S. Application Data

(60) Provisional application No. 61/740,914, filed on Dec. 21, 2012.

(51) Int. Cl.
 *C23C 16/00* (2006.01)
 *C23F 1/00* (2006.01)
 (Continued)

(52) U.S. Cl.
 CPC ...... *C23C 16/455* (2013.01); *C23C 16/45536* (2013.01); *C23C 16/45544* (2013.01); *C23C 16/45565* (2013.01); *Y10T 137/8593* (2015.04)

(58) Field of Classification Search
 USPC ............... 118/715, 723 R, 723 ME, 723 ER, 118/723 IR; 156/345.33, 345.34, 345.35;
 (Continued)

(56) References Cited

U.S. PATENT DOCUMENTS

| 5,597,439 A | 1/1997 | Salzman |
| 5,614,026 A | 3/1997 | Williams |

(Continued)

FOREIGN PATENT DOCUMENTS

| CN | 1574229 A | 2/2005 |
| CN | 101405433 A | 4/2009 |

(Continued)

OTHER PUBLICATIONS

U.S. Appl. No. 13/934,620, filed Jul. 3, 2013, entitled "Multi-Plenum Showerhead With Temperature Control."

(Continued)

*Primary Examiner* — Rakesh K Dhingra
(74) *Attorney, Agent, or Firm* — Weaver Austin Villeneuve & Sampson LLP

(57) ABSTRACT

A radical source for supplying radicals during atomic layer deposition semiconductor processing operations is provided. The radical source may include a remote volume, a baffle volume, and a baffle that partitions the remote volume from the baffle volume. The baffle volume and the remote volume may be fluidly connected through the baffle via a plurality of baffle holes. The baffle may be offset from a faceplate with a plurality of first gas distribution holes fluidly connected with the baffle volume. A baffle gas inlet may be fluidly connected with the baffle volume, and a first process gas inlet may be fluidly connected with the remote volume. Baffle gas may be flowed into the baffle volume to prevent radicalized first process gas in the remote volume from flowing through the baffle volume and the faceplate.

24 Claims, 20 Drawing Sheets

(51) Int. Cl.
*H01L 21/306* (2006.01)
*C23C 16/455* (2006.01)

(58) Field of Classification Search
USPC .................................................. 315/111.21
See application file for complete search history.

(56) References Cited

U.S. PATENT DOCUMENTS

| | | | |
|---|---|---|---|
| 5,871,586 A | 2/1999 | Crawley et al. | |
| 5,919,382 A | 7/1999 | Qian et al. | |
| 6,036,878 A | 3/2000 | Collins | |
| 6,054,013 A | 4/2000 | Collins et al. | |
| 6,059,885 A | 5/2000 | Ohashi et al. | |
| 6,089,472 A | 7/2000 | Carter | |
| 6,148,761 A | 11/2000 | Majewski et al. | |
| 6,200,412 B1 | 3/2001 | Kilgore et al. | |
| 6,205,869 B1 | 3/2001 | Schadt et al. | |
| 6,251,188 B1* | 6/2001 | Hashimoto | C23C 16/4404 |
| | | | 118/715 |
| 6,291,793 B1 | 9/2001 | Qian et al. | |
| 6,306,247 B1* | 10/2001 | Lin | H01J 37/321 |
| | | | 118/723 E |
| 6,364,949 B1 | 4/2002 | Or et al. | |
| 6,387,182 B1 | 5/2002 | Horie et al. | |
| 6,387,207 B1* | 5/2002 | Janakiraman | H01J 37/32357 |
| | | | 118/723 ME |
| 6,565,661 B1 | 5/2003 | Nguyen | |
| 6,635,117 B1 | 10/2003 | Kinnard et al. | |
| 6,727,654 B2 | 4/2004 | Ogawa et al. | |
| 6,782,843 B2* | 8/2004 | Kinnard | C23C 16/4411 |
| | | | 118/723 E |
| 7,296,534 B2 | 11/2007 | Fink | |
| 7,479,303 B2 | 1/2009 | Byun | |
| 7,846,291 B2 | 12/2010 | Otsuki | |
| 7,931,749 B2 | 4/2011 | Amikura et al. | |
| 7,976,631 B2 | 7/2011 | Burrows et al. | |
| 8,083,853 B2 | 12/2011 | Choi et al. | |
| 8,231,799 B2 | 7/2012 | Bera et al. | |
| 8,298,370 B2 | 10/2012 | Byun | |
| 8,308,865 B2 | 11/2012 | Kim et al. | |
| 8,328,939 B2 | 12/2012 | Choi et al. | |
| 8,361,275 B2 | 1/2013 | Tahara et al. | |
| 8,361,892 B2 | 1/2013 | Tam et al. | |
| 8,419,959 B2 | 4/2013 | Bettencourt et al. | |
| 8,512,509 B2 | 8/2013 | Bera et al. | |
| 8,679,956 B2 | 3/2014 | Tam et al. | |
| 8,721,791 B2 | 5/2014 | Tiner et al. | |
| 8,764,902 B2 | 7/2014 | Suzuki et al. | |
| 8,869,742 B2 | 10/2014 | Dhindsa et al. | |
| 8,882,913 B2 | 11/2014 | Byun et al. | |
| 9,057,128 B2 | 6/2015 | Olgado | |
| 9,315,897 B2 | 4/2016 | Byun et al. | |
| 9,349,619 B2 | 5/2016 | Kawamata et al. | |
| 9,441,791 B2 | 9/2016 | Mizusawa et al. | |
| 9,447,499 B2 | 9/2016 | Roy et al. | |
| 9,476,121 B2 | 10/2016 | Byun et al. | |
| 9,677,176 B2 | 6/2017 | Chandrasekharan et al. | |
| 10,023,959 B2 | 7/2018 | Sung et al. | |
| 2002/0017243 A1 | 2/2002 | Pyo | |
| 2003/0010451 A1* | 1/2003 | Tzu | C23C 16/45512 |
| | | | 156/345.33 |
| 2003/0051665 A1 | 3/2003 | Zhao et al. | |
| 2003/0054099 A1 | 3/2003 | Jurgensen et al. | |
| 2004/0216844 A1* | 11/2004 | Janakiraman | C23C 16/4405 |
| | | | 156/345.33 |
| 2004/0226507 A1* | 11/2004 | Carpenter | C23C 16/45525 |
| | | | 118/715 |
| 2005/0000430 A1 | 1/2005 | Jang et al. | |
| 2005/0092248 A1 | 5/2005 | Lee et al. | |
| 2005/0241579 A1 | 11/2005 | Kidd | |
| 2005/0241765 A1 | 11/2005 | Dhindsa et al. | |
| 2005/0241767 A1* | 11/2005 | Ferris | H01J 37/3244 |
| | | | 156/345.35 |
| 2006/0021703 A1 | 2/2006 | Umotoy et al. | |
| 2006/0191637 A1 | 8/2006 | Zajac et al. | |
| 2006/0228496 A1 | 10/2006 | Choi et al. | |
| 2006/0263522 A1 | 11/2006 | Byun | |
| 2007/0068798 A1 | 3/2007 | Honda et al. | |
| 2007/0110918 A1* | 5/2007 | Yuda | C23C 16/402 |
| | | | 427/561 |
| 2007/0163440 A1 | 7/2007 | Kim et al. | |
| 2007/0193515 A1 | 8/2007 | Jeon et al. | |
| 2007/0215048 A1* | 9/2007 | Suzuki | C23C 16/16 |
| | | | 118/725 |
| 2007/0264427 A1 | 11/2007 | Shinriki et al. | |
| 2007/0272154 A1 | 11/2007 | Amikura et al. | |
| 2008/0017315 A1* | 1/2008 | Fukuchi | H01J 37/32357 |
| | | | 156/345.27 |
| 2008/0020146 A1 | 1/2008 | Choi et al. | |
| 2008/0081124 A1 | 4/2008 | Johanson et al. | |
| 2008/0156264 A1 | 7/2008 | Fair et al. | |
| 2008/0156631 A1* | 7/2008 | Fair | H01J 37/32357 |
| | | | 204/164 |
| 2009/0095222 A1 | 4/2009 | Tam et al. | |
| 2009/0095621 A1* | 4/2009 | Kao | H01J 37/32082 |
| | | | 204/298.32 |
| 2009/0098276 A1 | 4/2009 | Burrows et al. | |
| 2009/0169744 A1 | 7/2009 | Byun et al. | |
| 2009/0178615 A1 | 7/2009 | Kim et al. | |
| 2009/0202721 A1 | 8/2009 | Nogami et al. | |
| 2009/0223449 A1* | 9/2009 | Ishida | H01L 21/67069 |
| | | | 118/715 |
| 2009/0236313 A1 | 9/2009 | Qiu et al. | |
| 2009/0266911 A1 | 10/2009 | Kim et al. | |
| 2009/0320756 A1* | 12/2009 | Tanaka | H01J 37/32192 |
| | | | 118/723 MW |
| 2010/0003405 A1 | 1/2010 | Kappeler | |
| 2010/0003406 A1 | 1/2010 | Lam et al. | |
| 2010/0184298 A1 | 7/2010 | Dhindsa | |
| 2010/0263588 A1 | 10/2010 | Zhiyin | |
| 2010/0300359 A1 | 12/2010 | Armour et al. | |
| 2011/0023782 A1 | 2/2011 | Han | |
| 2011/0039402 A1 | 2/2011 | Yamazaki et al. | |
| 2011/0048325 A1 | 3/2011 | Choi et al. | |
| 2011/0052833 A1 | 3/2011 | Hanawa et al. | |
| 2011/0065276 A1* | 3/2011 | Ganguly | H01L 21/0223 |
| | | | 438/694 |
| 2011/0073038 A1 | 3/2011 | Chien et al. | |
| 2011/0088847 A1* | 4/2011 | Law | H01J 37/3244 |
| | | | 156/345.34 |
| 2011/0253044 A1 | 10/2011 | Tam et al. | |
| 2011/0256315 A1 | 10/2011 | Tam et al. | |
| 2011/0256692 A1 | 10/2011 | Tam et al. | |
| 2011/0308551 A1 | 12/2011 | Chung et al. | |
| 2012/0052216 A1 | 3/2012 | Hanawa et al. | |
| 2012/0135609 A1* | 5/2012 | Yudovsky | C23C 16/45548 |
| | | | 438/758 |
| 2012/0161405 A1 | 6/2012 | Mohn et al. | |
| 2012/0225564 A1 | 9/2012 | Adachi et al. | |
| 2012/0269968 A1 | 10/2012 | Rayner, Jr. | |
| 2013/0052804 A1 | 2/2013 | Song | |
| 2013/0109159 A1 | 5/2013 | Carlson | |
| 2013/0288485 A1 | 10/2013 | Liang et al. | |
| 2013/0341433 A1 | 12/2013 | Roy et al. | |
| 2014/0103145 A1 | 4/2014 | White et al. | |
| 2014/0235069 A1 | 8/2014 | Breiling et al. | |
| 2014/0272185 A1 | 9/2014 | Na et al. | |
| 2014/0299681 A1 | 10/2014 | Kashyap et al. | |
| 2015/0007770 A1 | 1/2015 | Chandrasekharan et al. | |
| 2015/0007771 A1 | 1/2015 | Silva et al. | |
| 2015/0377481 A1 | 12/2015 | Smith et al. | |
| 2016/0348242 A1 | 12/2016 | Sung et al. | |
| 2018/0340256 A1 | 11/2018 | Sung et al. | |

FOREIGN PATENT DOCUMENTS

| | | |
|---|---|---|
| CN | 101423936 A | 5/2009 |
| CN | 101423937 A | 5/2009 |
| CN | 102424956 A | 4/2012 |
| CN | 103521956 A | 1/2014 |
| CN | 103890911 A | 6/2014 |
| JP | H05-186292 A | 7/1993 |

(56) References Cited

FOREIGN PATENT DOCUMENTS

| JP | H08239775 A | 9/1996 |
|---|---|---|
| JP | 2002-030445 A | 1/2002 |
| JP | 2002-033311 A | 1/2002 |
| JP | 2003-533878 A | 11/2003 |
| JP | 2005-303292 A | 10/2005 |
| JP | 2006-261217 A | 9/2006 |
| JP | 2007-142363 A | 6/2007 |
| JP | 2007-227789 A | 9/2007 |
| JP | 2010-062383 A | 3/2010 |
| JP | 2010-84190 A | 4/2010 |
| JP | 2010-232402 A | 10/2010 |
| JP | 2012-500471 A | 1/2012 |
| JP | 2012-533890 A | 12/2012 |
| TW | 490705 B | 6/2002 |
| TW | 492045 B | 6/2002 |
| TW | 200710928 A | 3/2007 |
| TW | 201229300 A | 7/2012 |
| WO | WO 0188962 A1 | 11/2001 |
| WO | WO 2011-009002 A2 | 1/2011 |
| WO | WO 2011/011532 | 1/2011 |
| WO | WO 2011/044451 A2 | 4/2011 |
| WO | WO 2012/122054 A2 | 9/2012 |

OTHER PUBLICATIONS

U.S. Appl. No. 13/934,597, filed Jul. 3, 2013, entitled "Multi-Plenum, Dual-Temperature Showerhead."
U.S. Office Action dated Mar. 13, 2015 issued in U.S. Appl. No. 13/531,254.
U.S. Office Action dated Sep. 17, 2015 issued in U.S. Appl. No. 13/531,254.
U.S. Notice of Allowance dated Jan. 15, 2016 issued in U.S. Appl. No. 13/531,254.
Chinese Office Action [no translation] dated Dec. 9, 2015 issued in CN 201410052998.X.
Singapore Search Report and Written Opinion dated Jul. 7, 2015 issued in SG Patent Application No. 201401171-2.
U.S. Office Action dated Apr. 7, 2016 issued in U.S. Appl. No. 13/934,597.
U.S. Notice of Allowance dated May 12, 2016 issued in U.S. Appl. No. 13/531,254.
Singapore Final Examination Report dated Jan. 12, 2016 issued in Application No. SG 201401171-2.
Chinese First Office Action dated Mar. 2, 2016 issued in Application No. CN 201410312720.1.
Chinese First Office Action dated Dec. 9, 2015 issued in Application No. CN 201410052998.X.
Chinese Second Office Action dated Jul. 27, 2016 issued in Application No. CN 201410052998.X.
U.S. Office Action dated Oct. 12, 2016 issued in U.S. Appl. No. 13/934,620.
U.S. Final Office Action dated Sep. 16, 2016 issued in U.S. Appl. No. 13/934,597.
U.S. Notice of Allowance dated Jan. 10, 2017 issued in U.S. Appl. No. 13/934,597.
Taiwan Examination and Search Report dated Oct. 13, 2016 issued in Application No. TW 102122169.
U.S. Final Office Action dated Jun. 22, 2017 issued in U.S. Appl. No. 13/934,620.
U.S. Notice of Allowance dated Apr. 14, 2017 issued in U.S. Appl. No. 13/934,597.
Taiwan Examination and Search Report dated Apr. 11, 2017 issued in Application No. TW 102147584.
Chinese Third Office Action dated Mar. 2, 2017 issued in Application No. CN 201410052998.X.
Taiwan Examination and Search Report dated May 12, 2017 issued in Application No. TW 103104956.
U.S. Office Action dated Nov. 20, 2017 issued in U.S. Appl. No. 13/934,620.
Chinese Fourth Office Action dated Sep. 13, 2017 issued in Application No. CN 201410052998.X.
Japanese First Office Action dated Nov. 7, 2017 issued in Application No. JP 2014-021856.
Taiwan First Office Action dated Jul. 3, 2018 issued in Application No. TW 107110096.
U.S. Notice of Allowance dated Mar. 8, 2018 issued in U.S. Appl. No. 13/934,620.
Taiwanese First Decision of Refusal dated Nov. 20, 2017 issued in Application No. TW 102147584.
Japanese First Office Action [Notification of Reasons for Rejection] dated Feb. 13, 2018 issued in Application No. JP 2014-130967.
Chinese First Office Action dated Apr. 10, 2018 issued in Application No. CN 201610361563.2.
U.S. Final Office Action dated Sep. 13, 2018 issued in U.S. Appl. No. 13/934,620.
U.S. Advisory Action dated Dec. 6, 2018 issued in U.S. Appl. No. 13/934,620.
U.S. Office Action dated Nov. 28, 2018 issued in U.S. Appl. No. 16/035,491.

* cited by examiner

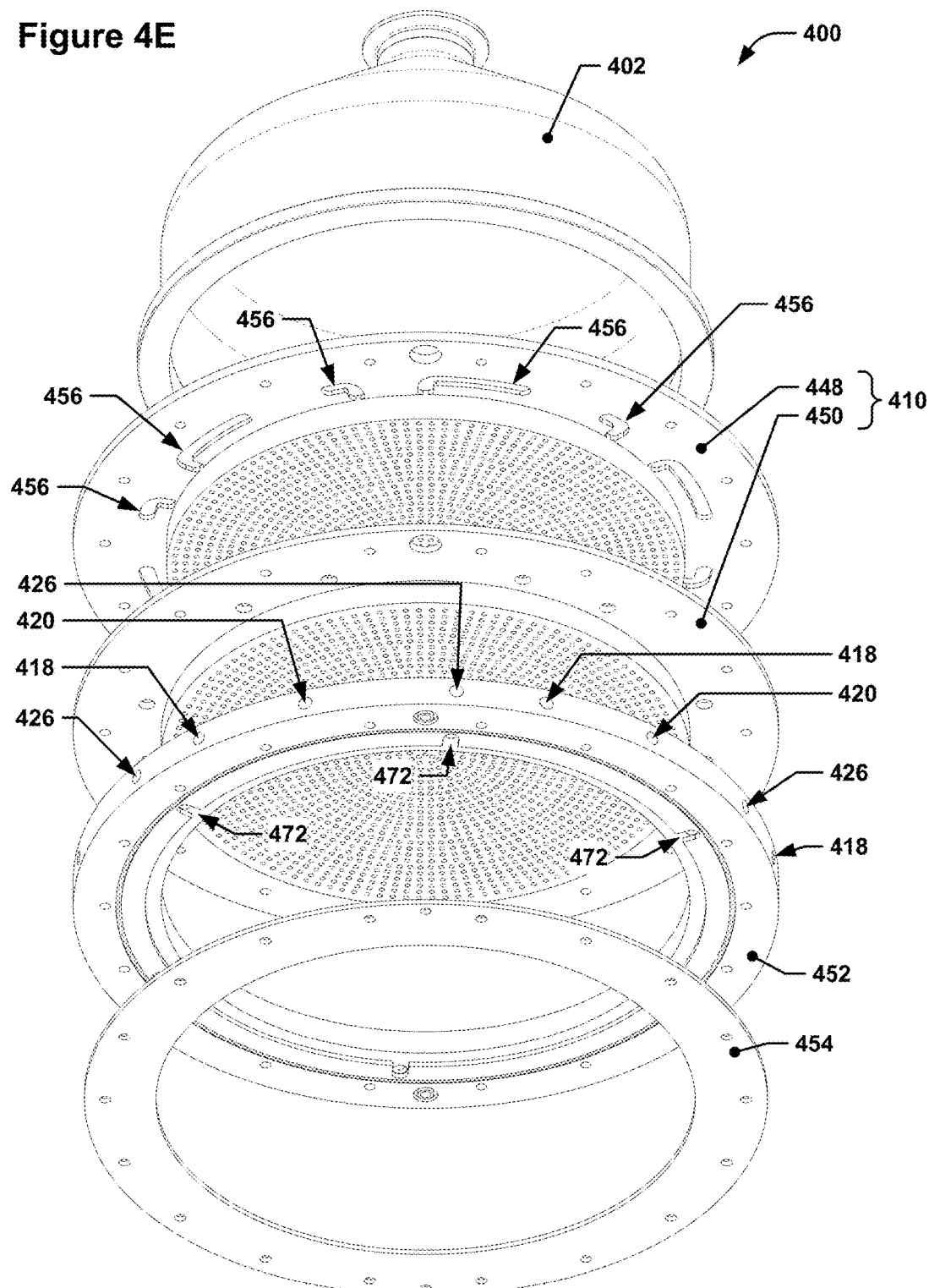

RADICAL SOURCE DESIGN FOR REMOTE PLASMA ATOMIC LAYER DEPOSITION

CROSS REFERENCE TO RELATED APPLICATION

This application claims benefit under 35 U.S.C. § 119(e) to U.S. Provisional Application No. 61/740,914, filed Dec. 21, 2012, titled "RADICAL SOURCE DESIGN FOR REMOTE PLASMA ATOMIC LAYER DEPOSITION," which is incorporated by reference herein in its entirety.

BACKGROUND OF THE INVENTION

Semiconductor processing tools often use radical sources to distribute radicalized process gas across a semiconductor wafer during processing, e.g., during atomic layer deposition (ALD) processing. Such radical sources may include a faceplate that faces the wafer during processing, and a number of gas distribution holes may be distributed across the faceplate to facilitate radicalized gas delivery to the wafer from within the radical source.

During some semiconductor manufacturing processes, e.g., plasma-enhanced atomic layer deposition (PEALD), semiconductor fabrication process gases may be converted into a plasma to produce radicals used in various process steps. Such plasma-enhanced processes may provide advantages over, for example, thermal atomic layer deposition since such processes may be performed with lower process temperatures and greater flexibility in process chemistry, and may provide denser deposition films. Plasma conversion, however, may also be damaging to the wafer, e.g., by oxidizing the underlying silicon of the wafer or an ultra-low K dielectric used in the process. To reduce such damage potential, such plasmas may be located so as to be "remote" from the wafer; such processes are commonly referred to as remote plasma atomic layer deposition (RPALD) processes. For example, some radical sources may have an internal volume within which the plasma may be generated. This internal volume may be separated from the wafer by the radical source faceplate (making the plasma "remote" from the wafer), somewhat shielding the wafer from possible damage arising from plasma conversion. The gas distribution holes in the faceplate may allow radicals produced by the remotely-generated plasma to flow out of the radical source and onto the wafer.

FIG. 1 depicts a conceptual, high-level flow chart for an RPALD technique. The process may begin in block 102, where a wafer may be introduced into an RPALD reactor for processing. In block 104, a precursor may be flowed into the reactor and across the wafer. The precursor then experiences a largely self-limiting reaction with the wafer that forms a deposition layer on the wafer of a highly-uniform conformality and having low thickness. ALD films are of a uniform thickness on every surface of a wafer—the tops of islands as well as the sides and bottoms of trenches—providing 100% step coverage, or a nearly perfect conformal coating, regardless of feature size or aspect ratio. Given the largely self-limiting nature of the reaction, the thickness of the deposited layer is much more insensitive to process parameter variations than other semiconductor processes, such as plasma enhanced chemical vapor deposition (PECVD). The thickness of an RPALD-deposited layer may, for example, be largely determined by parameters such as precursor selection, wafer material selection, and process temperature. After the precursor-wafer reaction has been allowed to occur, the remaining, unreacted precursor may be purged from the reactor in block 106. In block 108, radicals may be flowed into the reactor and across the wafer from a remote plasma source. The radicals may then react with the deposited precursor. This reaction may alter the precursor film on the wafer and make the precursor film capable of reacting with further precursor gas that is flowed across the wafer, allowing for a further layer of precursor to be deposited on the wafer. After the radical/precursor film reaction has been allowed to occur, the remaining radicals in the reaction chamber may be purged in block 110. In block 112, a decision may be made as to whether the deposited film is of the desired thickness (or, alternatively, whether sufficient reaction cycles have been performed). If additional thickness is desired, the process may return to block 104. If the thickness is at the desired level, the process may end in block 114.

The purge cycles are needed to mitigate or eliminate the possibility that the precursor gas will mix with the radicalized gas that is flowed into the reactor, and vice-versa. Such precursor/radicalized gas mixing can lead to precursor/radical reactions that, in effect, transform an ALD process into a chemical vapor deposition (CVD) process. Since one of the benefits of ALD, PEALD, and RPALD is that such processes allow for thin film depositions of much higher conformality than CVD processes, such precursor/radical mixing is highly undesirable. Another undesirable side effect of such mixing is that some ALD chemistries may, when mixed, form particulates that may interfere with ALD processing, e.g., by creating electrical shorts or other problems. Accordingly, each precursor and radical flow into the reactor is separated by a flow of purge gas into the reactor.

While ALD-type processes provide superior film uniformity as compared with CVD films, ALD-type processes are generally slower than CVD processes since ALD requires that a film be built up by many sequential reaction cycles (a single reaction cycle may, for example, correspond to blocks 104 through 110 of FIG. 1) rather than as a single layer deposition during one CVD reaction process.

SUMMARY OF THE INVENTION

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

In some implementations, a radical source for semiconductor processes may be provided. The radical source may include a faceplate. The faceplate may include a first plurality of gas distribution holes passing through the faceplate and exiting the radical source, and the first plurality of gas distribution holes may have a first total flow conductivity. The radical source may also include a first plenum volume partially bounded by the faceplate and a baffle having a first side and a second side opposing the first side. The baffle may be offset from the faceplate with the first side facing the faceplate. The baffle may divide the first plenum volume into a baffle volume located between the first side of the baffle and the faceplate and a remote volume partially bounded by the second side of the baffle. The baffle may also include a plurality of baffle holes fluidly connecting the baffle volume and the remote volume, the baffle holes having a total flow conductivity that is greater than the first total flow conductivity. The radical source may also include one or more baffle gas inlets configured to flow baffle gas into the baffle volume and one or more first process gas inlets configured to flow a first process gas into the remote volume.

In some implementations of the radical source, the one or more baffle gas inlets may be configured to flow the baffle gas into the baffle volume without first exposing the baffle gas to the remote volume and without first exposing the baffle gas to the first gas distribution holes.

In some implementations of the radical source, the one or more first process gas inlets may be configured to flow the first process gas into the remote volume without first exposing the first process gas to the baffle.

In some implementations of the radical source, the radical source may also include a remote plasma dome connected with the faceplate. In such implementations, the remote volume may be substantially defined by the baffle and the remote plasma dome. In some such implementations, the radical source may further include a radio-frequency generator configured to ignite a plasma using the first process gas within the remote volume.

In some implementations of the radical source, the radical source may further include a cover connected with the faceplate. The cover may include the one or more first process gas inlets. The radical source may also include an external remote plasma generator connected with the one or more first process gas inlets. The external remote plasma generator may be configured to supply radicalized first process gas to the remote volume via the one or more first process gas inlets.

In some implementations of the radical source, the radical source may also include an electrode plate connected with, and offset from, the baffle. The remote volume may be formed between the electrode plate and the baffle, and the electrode plate may be configured to ignite a plasma within the remote volume using the first process gas.

In some implementations of the radical source, the faceplate may be a dual-flow faceplate with a plurality of second gas distribution holes fluidly connected to a set of gas distribution channels within the faceplate. The gas distribution channels may be fluidly connected to one or more second process gas inlets and the second gas distribution holes may exit the faceplate on a side opposite the baffle.

In some implementations of the radical source, the baffle may be made from quartz or may be quartz-coated.

In some implementations of the radical source, the baffle volume may be further bounded by one or more outer circumferential surfaces and the one or more baffle gas inlets may be located along one or more of the outer surfaces of revolution.

In some implementations of the radical source, the radical source may further include a plurality of baffle gas inlets arranged across a side of the faceplate facing the baffle. The baffle gas inlets may fluidly connect to a set of baffle gas distribution channels within the faceplate and the baffle gas distribution channels may be configured to flow baffle gas into the baffle volume via the baffle gas inlets.

In some implementations of the radical source, the faceplate and the baffle may be of substantially the same size.

In some implementations of the radical source, the baffle volume may be an order of magnitude or more thinner in an axial direction substantially perpendicular to the faceplate than the remote volume is in the axial direction.

In some implementations of the radical source, the first gas distribution holes and the baffle holes may be arranged in matching patterns and the baffle holes may be larger than the first gas distribution holes.

In some implementations of the radical source, the first gas distribution holes and the baffle holes may be arranged in non-matching patterns. In some such implementations, the first gas distribution holes and the baffle holes may not overlap one another.

In some implementations of the radical source, the baffle may be liquid-cooled. In some such implementations, the baffle may include internal cooling passages that traverse the baffle and that do not intersect any of the baffle holes.

In some implementations of the radical source, the radical source may further include one or more baffle gas inlet pressure control valves configured to control baffle gas flow from the baffle gas inlets into the baffle volume and a controller including a memory device and one or more processors communicatively connected with the memory device and the one or more baffle gas inlet pressure control valves. The memory may store computer-executable instructions for controlling the one or more processors to open the one or more baffle gas inlet pressure control valves during first operations of an atomic layer deposition (ALD) cycle performed with the radical source where radicalized first process gas is to be substantially prevented from flowing through the faceplate via the first gas distribution holes, substantially close the one or more baffle gas inlet pressure control valves during second operations of the ALD cycle, the second operations including flowing radicalized first process gas through the faceplate via the first gas distribution holes, and repeat the first operations and the second operations in an alternating manner.

In some such implementations of the radical source, the faceplate may be a dual-flow faceplate with a plurality of second gas distribution holes fluidly connected to a set of gas distribution channels within the faceplate and the gas distribution channels may be fluidly connected to one or more second process gas inlets. The second gas distribution holes may exit the faceplate on a side opposite the baffle. In such implementations, the first operations may include flowing a second process gas out of the faceplate via the second gas distribution holes, and performing purge operations between each successive first operation and second operation and between each successive second operation and first operation.

In some implementations of the radical source, the radical source may further include a pumping port fluidly connected to the remote volume such that the baffle volume is not interposed between the remote volume and the pumping port.

In some implementations of the radical source, the one or more first process gas inlets and the one or more baffle gas inlets may be connected to the same gas source or separate sources of substantially the same gas.

In some such implementations, a three-way valve or other valve arrangement facilitating switchable gas delivery from a common source to one of two separate flow paths may be used to connect the one or more first process gas inlets and the one or more baffle gas inlets to the gas source.

In some implementations a method of operating a radical source in a remote plasma atomic layer fabrication process may be provided. The method may include providing radicalized first process gas within a remote volume of a radical source and flowing baffle gas into a baffle volume of the radical source. The baffle volume may be interposed between the remote volume and a faceplate of the radical source and have a plurality of first gas distribution holes facing a wafer reaction area. The baffle volume may be partitioned from the remote volume by a baffle and may be fluidly connected with the remote volume through the baffle by a plurality of baffle holes. The method may further include flowing a second process gas through a plurality of second gas distribution holes in the faceplate and towards the wafer reaction area and substantially stopping the flow of the second process gas through the plurality of second gas distribution holes. The method may also further include performing a first purge of the wafer reaction area to remove unreacted second process gas from the wafer reaction area after flow of the second process gas through the plurality of second gas distribution holes has been stopped, substantially stopping the flow of the baffle gas into the baffle volume after the first purge is complete, flowing the radicalized first process gas from the remote volume into the baffle volume, through the first gas distribution holes in the faceplate, and into the wafer reaction area, performing a second purge of the wafer reaction area, and restarting the flow of the baffle gas into the baffle volume. The activities from flowing a second process gas through a plurality of second gas distribution holes onwards may be repeated for each cycle in the atomic layer process.

In some such implementations of the method, the method may also include relieving pressure built up in the remote volume via a pumping port while the baffle gas is flowed into the baffle volume.

In some implementations of the method, the method may further include flowing a coolant through cooling channels in the baffle.

These and other aspects of various implementations are explained in more detail below.

BRIEF DESCRIPTION OF THE DRAWINGS

FIG. 4E depicts a reverse isometric exploded view of the gasket plate and components above the gasket plate of the example of the radical source of FIG. 4A.

FIGS. 4A through 4J are drawn to scale.

DETAILED DESCRIPTION

Examples of various implementations are illustrated in the accompanying drawings and described further below. It will be understood that the discussion herein is not intended to limit the claims to the specific implementations described. On the contrary, it is intended to cover alternatives, modifications, and equivalents as may be included within the spirit and scope of the invention as defined by the appended claims. In the following description, numerous implementation-specific details are set forth in order to provide a thorough understanding of the present invention. The present invention may be practiced without some or all of these implementation-specific details. In other instances, well-known process operations have not been described in detail in order not to unnecessarily obscure the present invention.

The present inventor has realized that RPALD processes suffer significant increases in processing time due to the fact that the remote plasma source that generates the radicals must typically be turned off during the process phases where radicals are not desired, e.g., precursor flow and purge gas flows, and then re-ignited to provide radicals for the radical flow phase. The time needed for such plasma re-ignition may adversely affect process through-put by introducing unneeded delay.

Moreover, remote plasma sources may also need to be purged of radicals after the radical flow phase to prevent radicals that are still present within the remote plasma source volume from seeping into the reaction area. The present inventor has also realized that remote plasma sources are often quite voluminous, and thus the time to purge remote plasma sources can be unacceptably long compared with other process steps. Both of these delays would be repeatedly encountered during RPALD processing.

The present inventor has realized that a new radical source design for use with remote plasma sources may allow for the remote plasma source to remain lit during the precursor gas delivery and purge gas delivery phases as well as during the radical delivery phase and that obviates the need to completely purge the remote plasma source of radicals during non-radicalized gas delivery phases. This drastically reduces the duration of each ALD reaction cycle since it is no longer necessary to extinguish/reignite the remote plasma source, nor is it necessary to purge the entire volume of the remote plasma source.

Figure 2A:
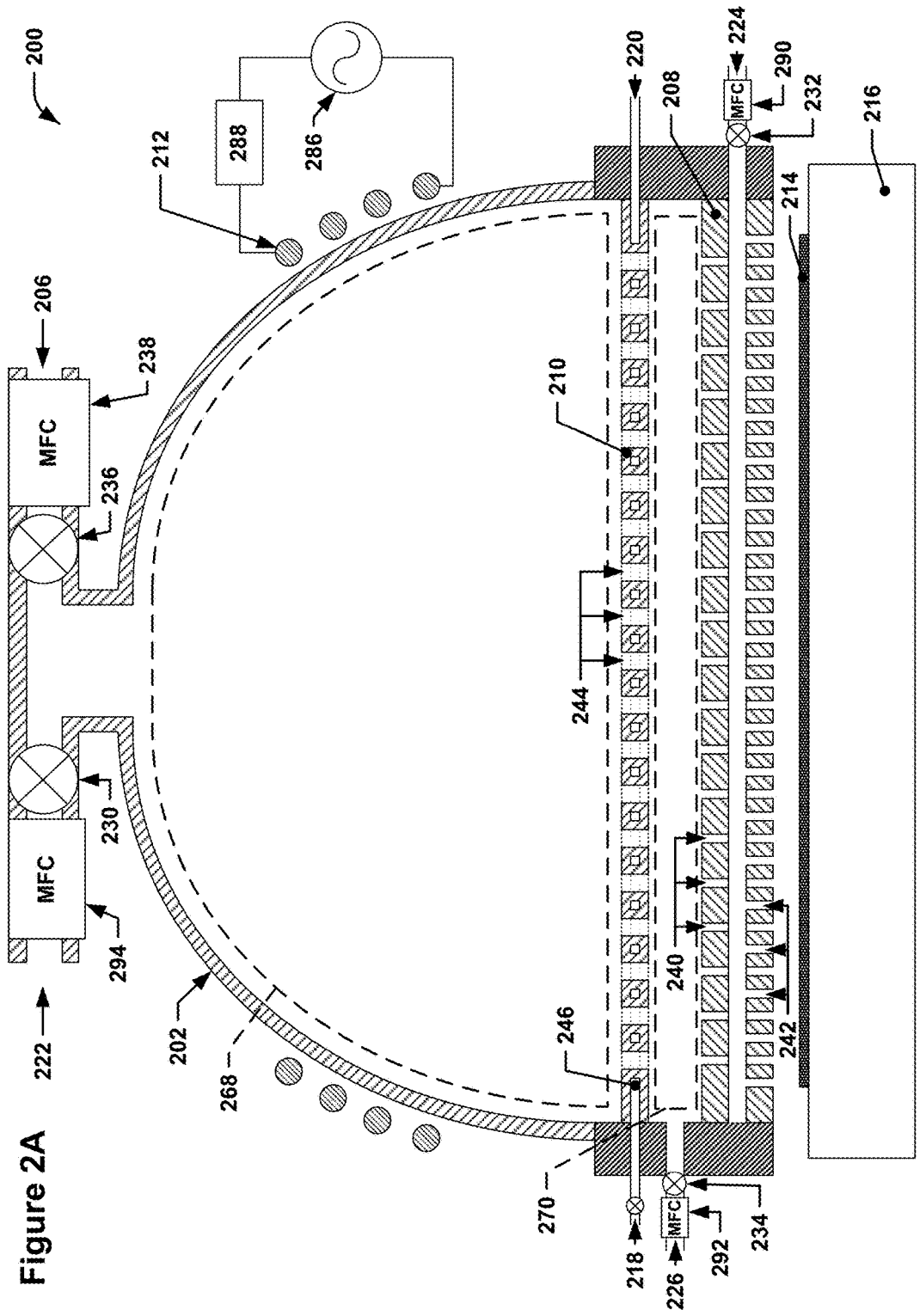
FIG. 2A depicts an example of a radical source.

FIG. 2A depicts an example of a radical source. Visible in FIG. 2A is a radical source 200. The radical source 200 may be mounted over a wafer support 216 that may be used to support a wafer 214; these components are shown, although they are not considered to be part of the radical source 200. The radical source 200 may be mounted in a chamber or reactor (not shown) capable of providing pressure, temperature, and other environmental conditions appropriate for performing semiconductor processing operations such as RPALD. The space between the wafer support 216 and the radical source 200 may, in general, be referred to in this disclosure as a wafer reaction area.

The radical source 200 may include a plasma dome 202 and a dual-flow faceplate 208. In some implementations, a simple faceplate, i.e., one that does not provide dual-flows, may be used. In the depicted implementation, however, a dual-flow faceplate is used. Also depicted is a baffle 210 that may separate a first plenum volume that is substantially bounded by the plasma dome 202 and the dual-flow faceplate 208 into a remote volume 268 and a baffle volume 270. The plasma dome 202 may have a first process gas inlet 222 configured to introduce a first process gas into the plasma dome 202 near the top of the plasma dome 202. A first process gas inlet mass flow controller 294 may be configured to allow the first process gas flow to be increased or decreased. In some implementations, a first process gas inlet valve 230, e.g., a gate valve or other mechanical seal valve also may be provided in order to seal the first process gas inlet 222. The first process gas inlet valve 230 may be located downstream of the first process gas inlet mass flow controller 294. In some implementations, a single valve may be used to provide both pressure control and sealing functions.

An RF generator 286 may be located outside of the plasma dome and configured to provide RF energy to RF coils 212 for generating a plasma within the plasma dome 202 from the first process gas, thereby generating first process gas radicals, i.e., radicalized first process gas, that may be flowed across the wafer as needed. A matching network 288 may be placed in series between the RF generator 286 and the RF coils 212 to ensure that the RF power is coupled to the RF coils correctly, i.e., the matching network 288 matches the impedance of the RF coils and the plasma that is generated.

The dual-flow faceplate 208 may include a set of first gas distribution holes 240 that pass completely through the dual-flow faceplate 208. The first gas distribution holes 240 allow gas that is within the baffle volume 270 to flow through the dual-flow faceplate 208 and towards the wafer support 216. Thus, for example, the first process gas that may be flowed into the plasma dome 202 via the first process gas inlet 222 may flow through the baffle 210, through the first gas distribution holes 240, and exit the dual-flow faceplate 208 from the side of the dual-flow faceplate 208 facing the wafer support 216.

Figure 1:
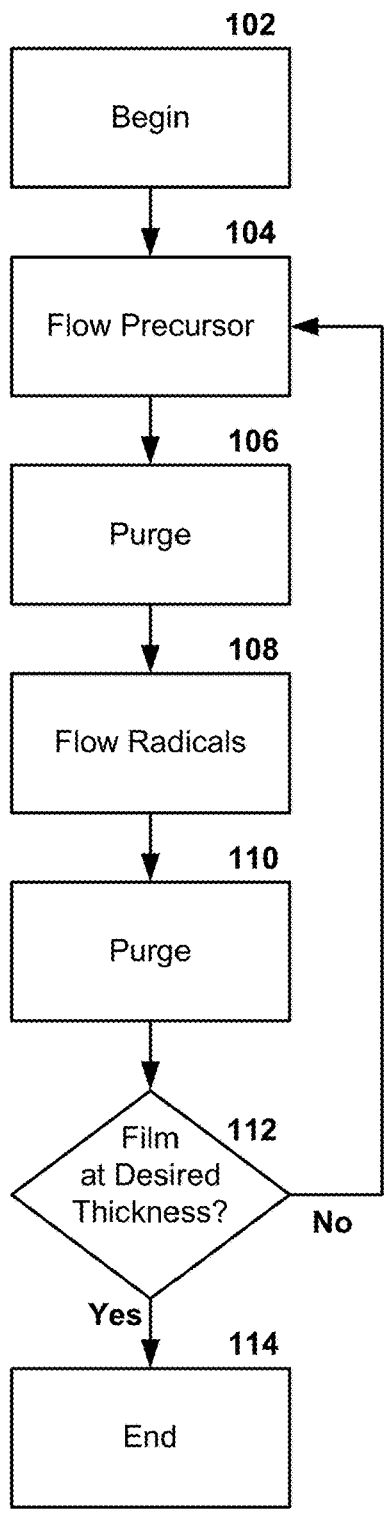
FIG. 1 depicts a conceptual, high-level flow chart for a PEALD technique.

The dual-flow faceplate 208 may also include a set of second gas distribution holes 242 that pass through the side of the dual-flow faceplate 208 that faces the wafer support 216 and that do not exit the side of the dual-flow faceplate 208 that faces away from the wafer support 216. The second gas distribution holes 242 may instead intersect with an internal flow passage or passages that traverse the dual-flow faceplate 208 and connect to a second process gas inlet 224. Thus, a second process gas, e.g., a gas such as the precursor discussed with reference to FIG. 1, that is introduced via the second process gas inlet 224 may flow through the internal passages, through the second gas distribution holes 242, and exit the dual-flow faceplate 208 on the side of the dual-flow faceplate 208 facing the wafer support 216. The flow of the second process gas into the second process gas inlet 224 may be controlled by a second process gas inlet mass flow controller 290. A second process gas inlet valve 232 may be located downstream of the second process gas inlet mass flow controller 290 to facilitate sealing of the second process gas inlet 224. In some implementations, the functionality provided by the second process gas inlet mass flow controller 290 and the second process gas inlet valve 232 may be provided by a single valve, although such a valve may be required to withstand millions of cycles of operation without undue performance degradation because an ALD process for any particular wafer may involve hundreds of deposition cycles, causing the second process gas inlet mass flow controller 290 to function hundreds of times during ALD processing for a single wafer. Similar substitutions may be made for other mass flow controller/valve combinations shown in this disclosure.

In addition to the baffle 210, the radical source 200 pictured in FIG. 2A may also include a baffle gas inlet or inlets 226, a baffle gas inlet valve or valves 234, and a baffle gas inlet mass flow controller 292 that may allow for the introduction of a baffle gas into the baffle volume 270 to counteract flow of radicalized first process gas from the remote volume 268 into the baffle volume 270. The baffle 210 may include a number of baffle holes 244 that pass through the baffle 210. The baffle holes 244 may provide an overall total flow conductance through the baffle 210 that is lower than the overall total flow conductance provided by the first gas distribution holes 240 through the dual-flow faceplate 208. This flow conductance mismatch may cause the baffle gas to be biased towards flow into the remote volume 268 rather than into the wafer reaction area via the first gas distribution holes 240. The operation of such a system is covered in further detail below.

The gas flows of the first process gas and the second process gas may be kept isolated from one another within the radical source 200 by virtue of the separate plenum spaces and gas distribution holes associated with each process gas. Once the process gases have left the radical source via the dual-flow faceplate 208, however, the separate plenum spaces no longer provide any isolative effect. The first process gas and the second process gas may, however, be kept further isolated from one another by performing purge cycles in between the sequential flows of such process gases. The purge cycles may be used to remove unreacted process gases from the wafer reaction area between the radical source 200 and the wafer support 216. This prevents, for example, unreacted first process gas in the wafer reaction area from mixing with newly-introduced second process gas, and vice versa, which could result in the ALD process being transformed, in effect, into a CVD process, resulting in a loss of the process uniformity that ALD provides. Such purge operations are covered in further detail below.

Figure 2B:
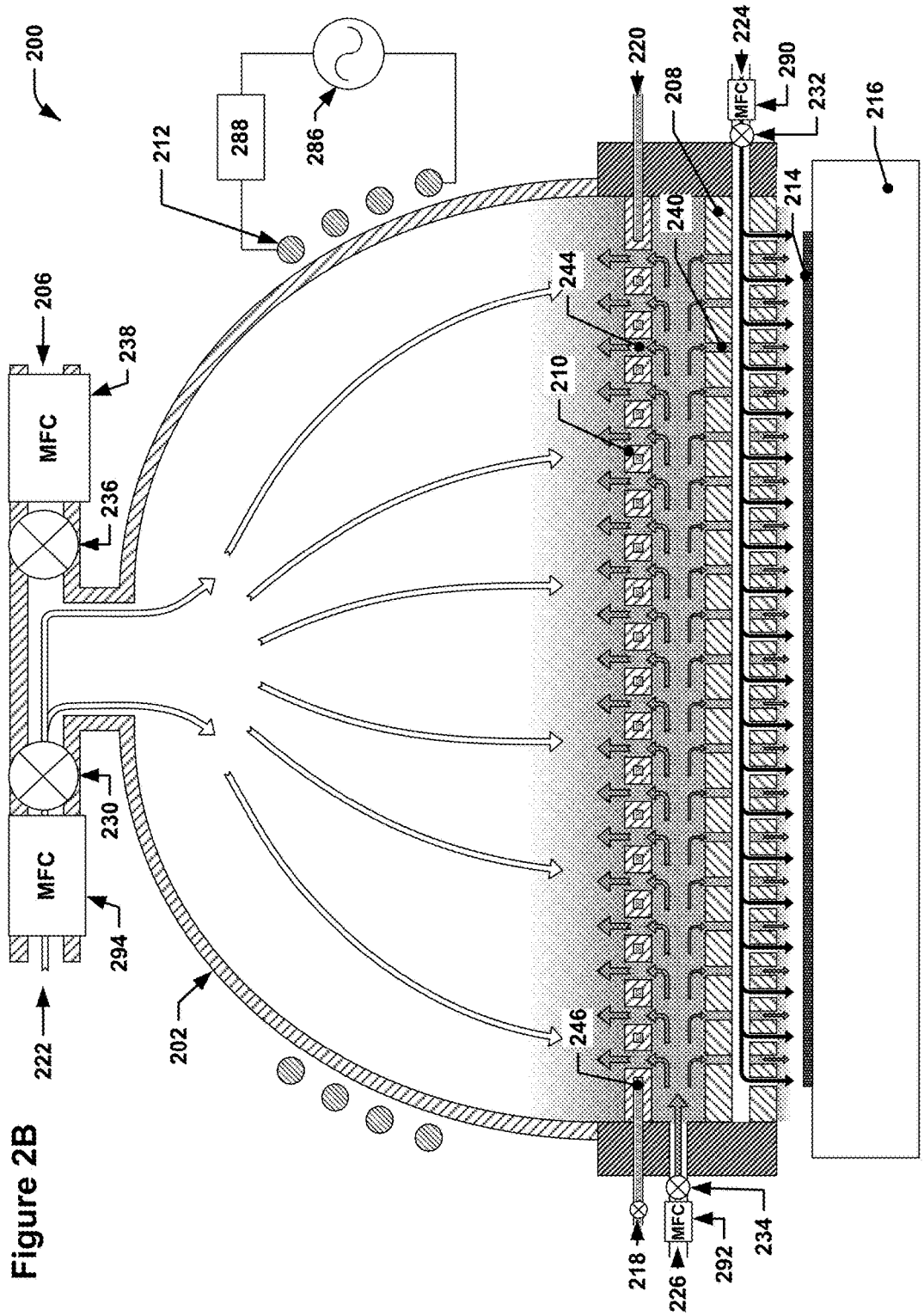
FIG. 2B depicts the example of the radical source from FIG. 2A in a process gas distribution mode.

FIG. 2B depicts the example of the radical source from FIG. 2A in a process gas distribution mode. In FIG. 2B, white arrows indicate flow of the first process gas, black arrows indicate the flow of the second process gas, and gray arrows indicate the flow of the baffle gas. As can be seen, the first process gas may flow into the plasma dome 202 via the first process gas inlet 222. At the same time, however, baffle gas may be flowed into the baffle volume 270 via the baffle gas inlet(s) 226. The baffle gas may escape the baffle volume 270 by flowing through the first gas distribution holes 240 and through the baffle holes 244.

The total flow conductance through the baffle 210 via the baffle holes 244 may be higher than the total flow conductance through the dual-flow faceplate 208 via the first gas distribution holes 240. Due to the flow conductance mismatch between the first gas distribution holes 240 and the baffle holes 244, the baffle gas may biased towards flow into the remote volume 268 and may, as it flows through the baffle holes 244 and enters the remote volume 268, counteract flow of the radicalized first process gas through the baffle holes 244. This may effectively prevent radicals in the first process gas from travelling through the baffle volume 270 and the first gas distribution holes 240 to reach the wafer 214. At the same time, the second process gas may flow into the dual-flow faceplate 208 via the second process gas inlet 224 and may exit the dual-flow faceplate 208 through the second gas distribution holes 242. The second process gas may then flow across the wafer and react with the wafer without, or substantially without, encountering radicals of the first process gas.

One issue with radical sources that are similar to the radical source 200 but that lack a baffle system such as that described is that, absent the baffle system, the plenum volume corresponding to the remote volume 268 and the baffle volume 270 in the illustrated example must generally be purged during each deposition cycle to prevent radicals within the plenum volume from flowing through the first gas distribution holes and into the wafer reaction area while the second process gas is being introduced into the wafer reaction area. Since the remote volume 268 and the baffle volume 270 are, relatively speaking, large when compared to other system volumes, purging this plenum volume may take an inordinate amount of time compared to a purge, for example, of the second process gas distribution channels within the faceplate. Moreover, such a purge would also generally require that the plasma be extinguished. When a subsequent processing operation requiring radicals generated within the plasma dome 202 is performed, the plenum volume must be re-filled with first process gas and the plasma must be re-ignited. The inclusion of a baffle system such as that shown in the Figures avoids many of these issues by allowing a reservoir of radicalized first process gas to be maintained within the remote volume 268 throughout the entire ALD cycle, including during second process gas flow into the wafer reaction area as well as during purge operations.

Figure 2C:
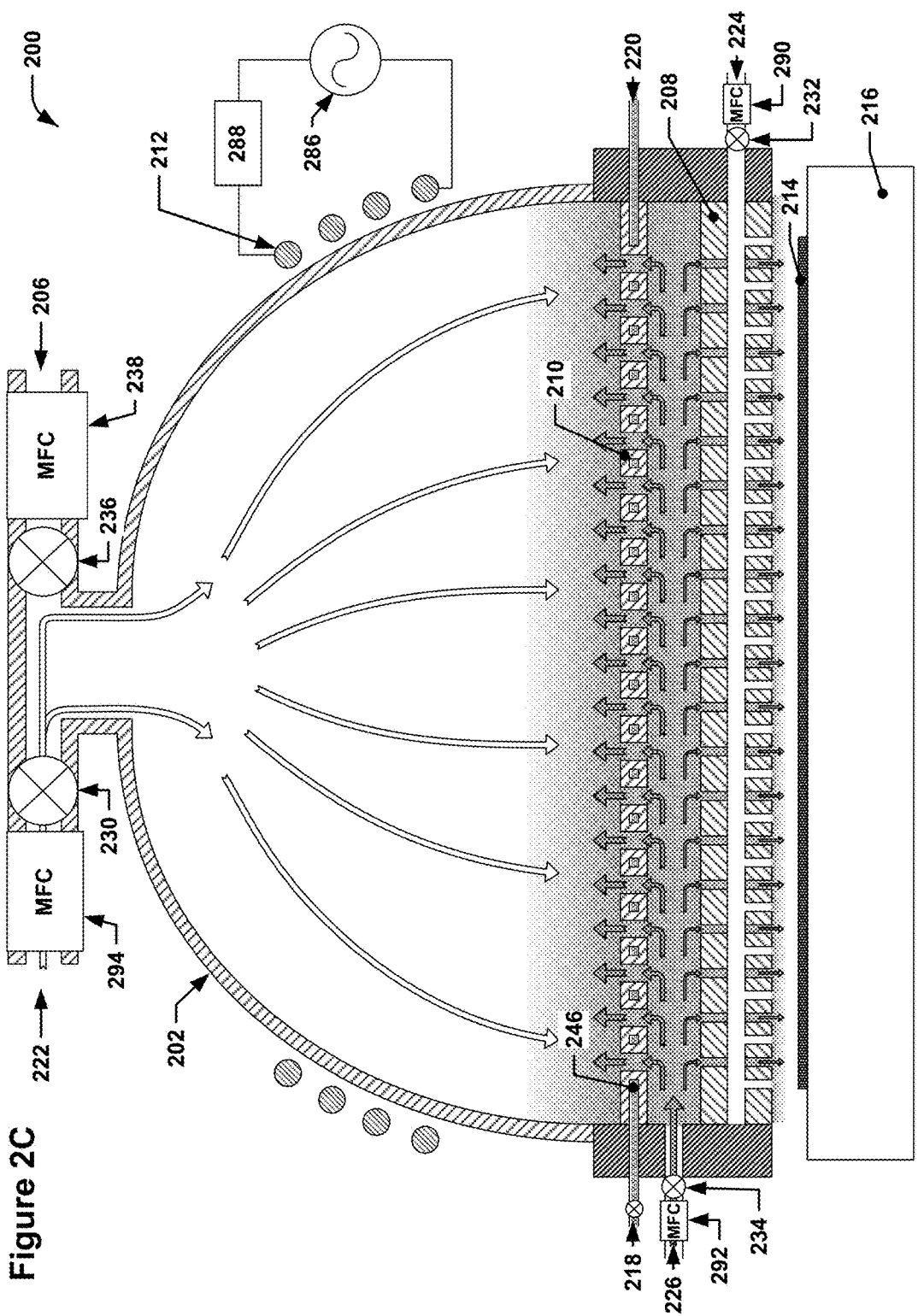
FIG. 2C depicts the example of the radical source from FIG. 2A during a purge operation following distribution of the second process gas.

FIG. 2C depicts the example of the radical source from FIG. 2A during a purge operation following distribution of the second process gas. In FIG. 2C, the second process gas has been shut off using the second process gas inlet mass flow controller 290 and is no longer being distributed via the dual-flow faceplate 208. As can be seen, the baffle gas may continue to be introduced into the baffle volume 270 via the baffle gas inlet 226 while the first process gas continues to be supplied to the remote volume 268 via the first process gas inlet 222; the baffle gas flow through the baffle holes 244 may continue to prevent radicalized first process gas from the remote volume 268 from flowing through the baffle 210 and the baffle volume 270 and into the wafer reaction area. The baffle gas that flows through the first gas distribution holes 240 may act as a purge gas that forces unreacted second process gas left over from the previous phase away from the wafer reaction area. In some implementations, a purge gas may also be flowed through the internal flow passage or passages and the second gas distribution holes 242 in the dual-flow faceplate 208 to purge any second process gas that remains within those passages and the second gas distribution holes 242. In such implementations, there may be a divert valve or a three-way valve (not shown) that allows the gas flow to the second process gas inlet 224 to be switched from a second process gas source to a purge gas source. The purge gas source may supply the same gas used for the baffle gas, or may supply a different gas. In either case, the flow of the second process gas may be stopped or effectively stopped during the purge cycle, for example, by reducing the flow through the second process gas inlet mass flow controller 290 to a minimum.

Figure 2D:
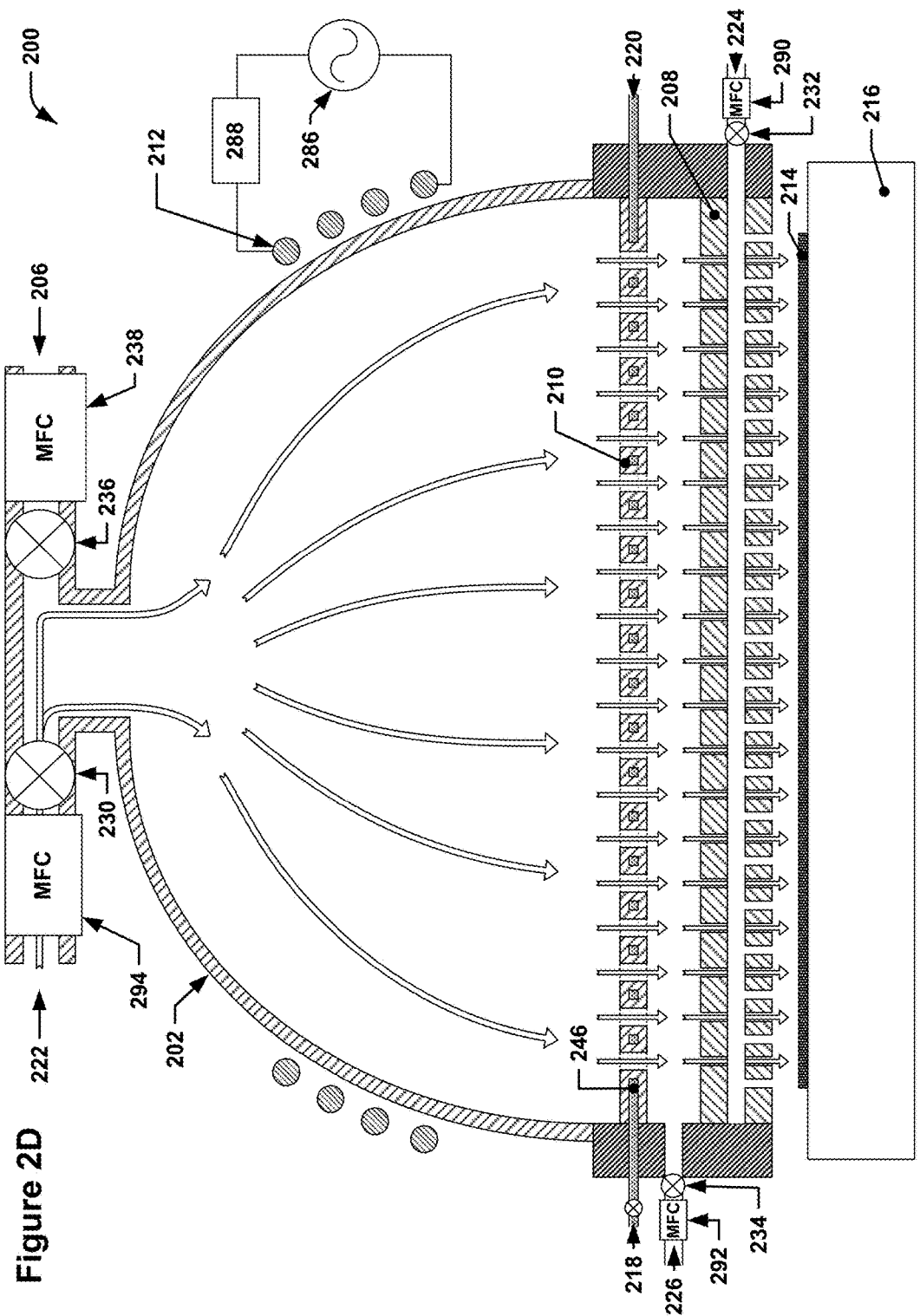
FIG. 2D depicts the example of the radical source from FIG. 2A as radicalized first process gas is flowed into the wafer reaction area.

FIG. 2D depicts the example of the radical source from FIG. 2A as radicalized first process gas is flowed from the remote volume 268, through the baffle holes 244 and the baffle volume 270, and into the wafer reaction area via the first gas distribution holes 240. During this phase of the ALD cycle, the baffle gas flow into the baffle volume 270 may be stopped or effectively stopped by reducing baffle gas flow to a minimum using the baffle gas inlet mass flow controller 292. Once the counter-flow of the baffle gas into the remote volume 268 ceases, the radicalized first process gas from the remote volume 268 may flow through the baffle holes 244, into the baffle volume 270, and, from the baffle volume 270, into the wafer reaction area via the first gas distribution holes 240. The flow of the second process gas through the second gas distribution holes 242 may be effectively stopped during flow of the radicalized first process gas through the first gas distribution holes 240 during this phase by use of the second process gas inlet mass flow controller 290.

Figure 2E:
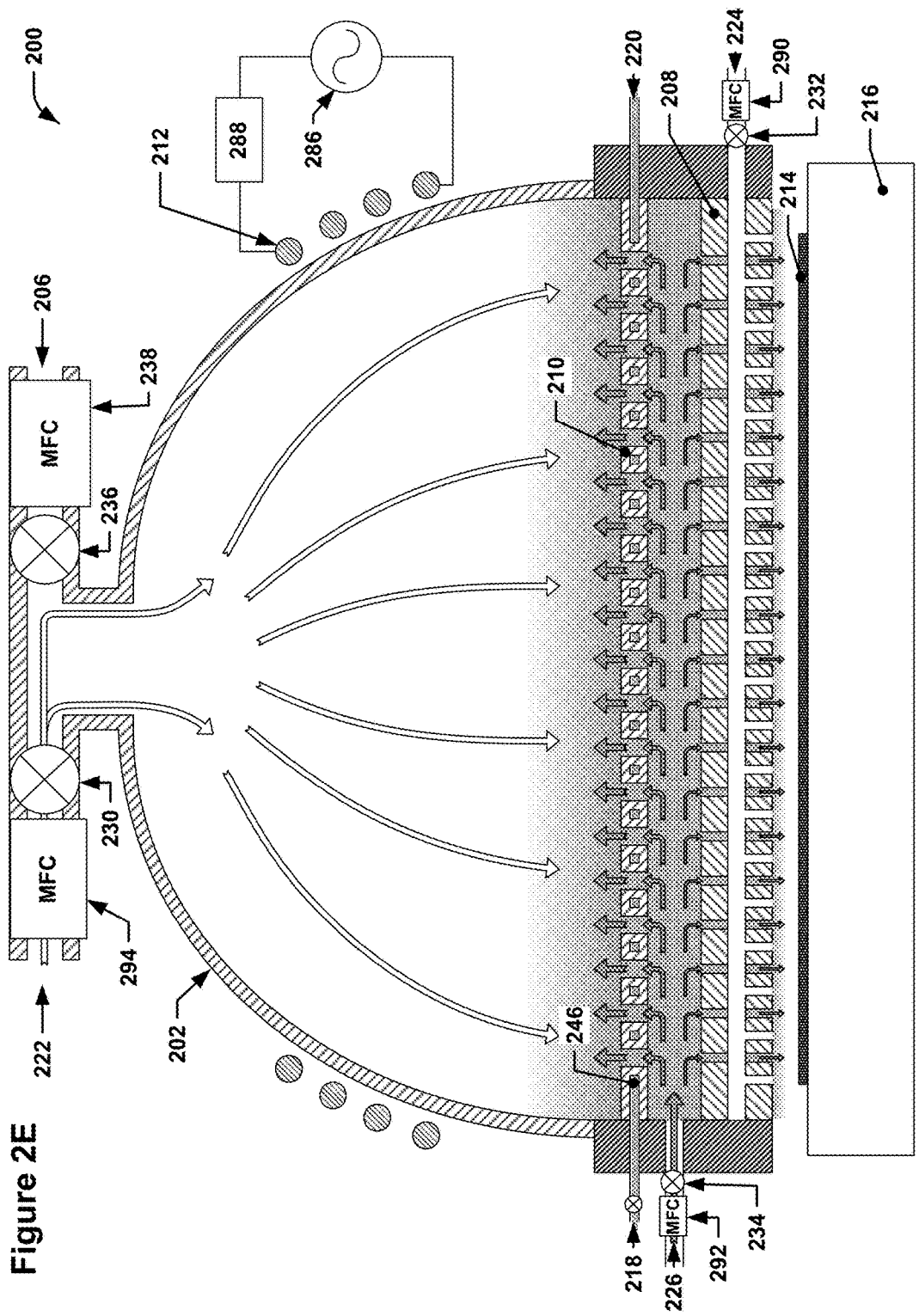
FIG. 2E depicts the example of the radical source from FIG. 2A after the radicalized first process gas flow into the wafer reaction area has stopped and a subsequent, additional purge operation is performed.

FIG. 2E depicts the example of the radical source from FIG. 2A after the radicalized first process gas flow into the wafer reaction area has stopped and a subsequent, additional purge operation is performed. The additional purge operation, as with the initial purge operation, includes flowing baffle gas into the baffle volume 270 via the baffle gas inlet(s) 226 while the radicalized first process gas remains in the remote volume 268. As before, the baffle gas may act to substantially prevent the flow of radicalized first process gas through the baffle 210, protecting the wafer reaction area against radicalized first process gas exposure during the additional purge operation. Additionally, baffle gas that flows from the baffle volume 270 and through the first gas distribution holes 240 may act to purge the wafer reaction area After the additional purge operation is completed, additional ALD cycles may be performed by repeating the operations depicted in FIGS. 2B through 2E as needed. In some implementations, during all such cycles for a given wafer, the plasma may be kept lit and a reservoir of the radicalized first process gas may be maintained in the remote volume, allowing for greatly reduced ALD cycle times as compared with existing systems requiring extinguishment/re-ignition of the plasma used or purging of radicalized first process gas from large plasma-containment volumes.

The baffle 210 also, in some implementations, may be cooled during ALD cycles. For example, the baffle 210 may have internal cooling channels 246 that thread between the baffle holes 244. Coolant, e.g., water or other liquid, may be introduced into the cooling channels 246 through a coolant inlet 218 and may exit the cooling channels via a coolant outlet 220. The coolant may be passed through a heat exchanger or other heat dissipation system before being recirculated through the baffle 210. Alternatively, the coolant may not be recirculated at all but may instead be connected with a facility supply and drain. Cooling the baffle 210 may reduce the possibility of recombination of the radicals with, for example, the baffle 210.

In some implementations, a vacuum pump port 206 may be included to allow excess pressure build-up in the remote volume 268 resulting from the introduction of the baffle gas and consequent reduction in radicalized first process gas flow to be relieved, thus preventing over-pressurization of the plasma dome 202. A vacuum port valve 236 may be provided to seal the vacuum pump port 206 from the remote volume 268. A mass flow controller 238 may be provided to allow for fine control of the pressure of the vacuum pump port 206 during pressure bleed-off; the mass flow controller 238 may operate in tandem with a pressure sensor (not shown), e.g., a capacitance manometer, to control pressure in the vacuum pump port 206. Other flow-controlling valve technologies may be used as appropriate in place of the mass flow controller 238.

Figure 2F:
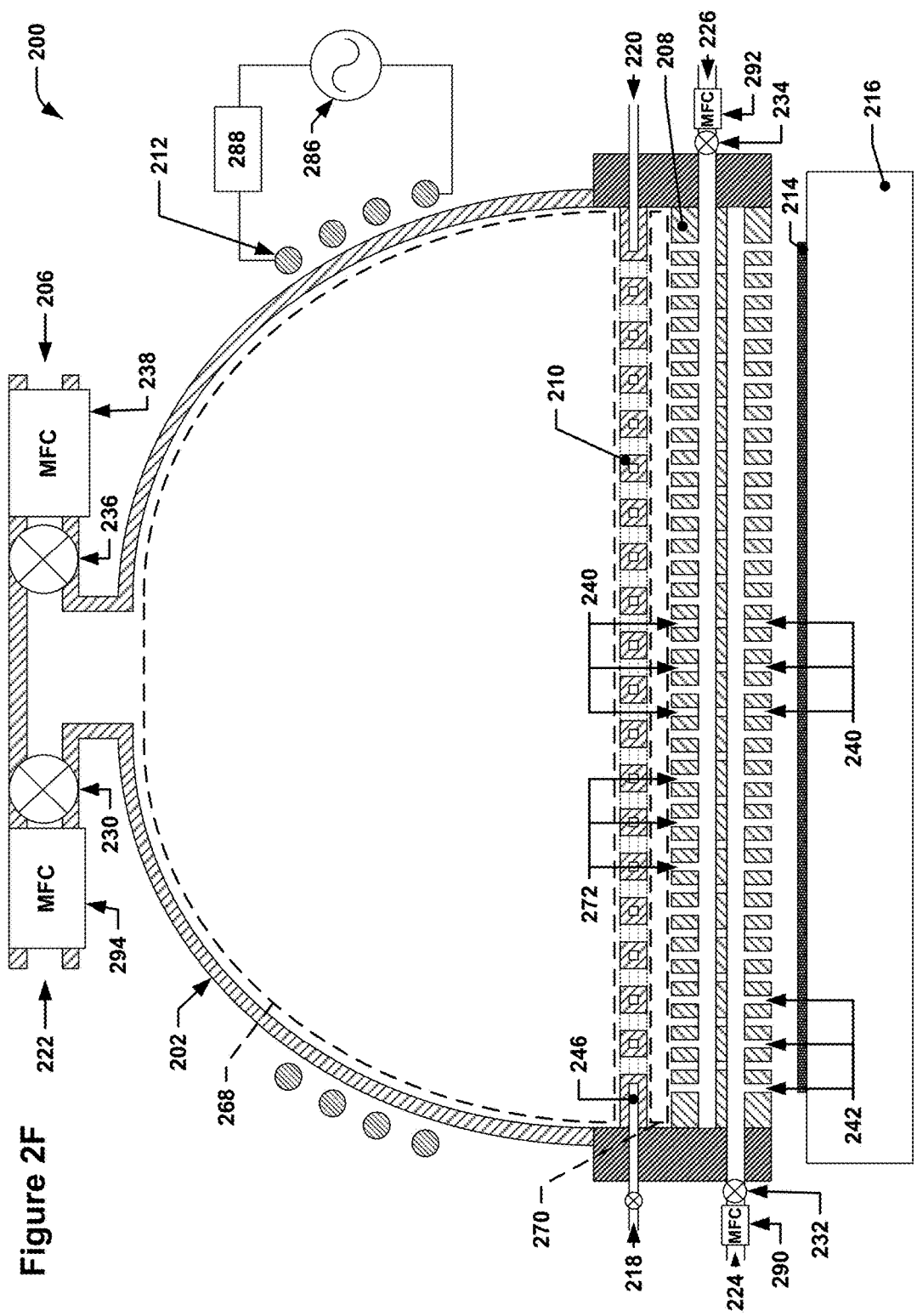
FIG. 2F depicts an example of a radical source with an alternate baffle configuration.

FIG. 2F depicts an example of a radical source with an alternate baffle configuration. The radical source 200, for example, may also feed baffle gas into the baffle volume 270 from locations other than the perimeter of the baffle volume. For example, the dual-flow faceplate 208 may include another set of internal channels that feed a set of baffle gas outlets 272 distributed across the side of the dual-flow faceplate 208 facing towards the baffle 210. Thus, the baffle gas may be introduced into the baffle volume 270 in a substantially uniform manner across the entire dual-flow faceplate 208 (although it may be more accurate to describe the dual-flow faceplate 208 as a "triple-flow" faceplate in this particular case due to the additional baffle gas flow).

A variety of baffle gases may be used in such implementations. The baffle gas may be selected so as to not interfere, or minimally interfere, with the plasma generated in the remote volume 268 or with the absorption of the process gases into the wafer. In some implementations, the baffle gas may be the same as the first process gas. For example, in some remote plasma atomic layer deposition (RPALD) processes, such as a process for depositing $SiO_2$, the first process gas may be $O_2$ or $N_2O$, and substantially the same gas may be used as the baffle gas. In such implementations, the plasma composition remains substantially unchanged when the baffle gas is introduced, and it may be possible to deactivate the flow of the first process gas into the remote volume 268 entirely since the plasma may continue to be fed by the baffle gas. This may have the effect of reversing the flow of gas within the remote volume 268. Instead of flowing from the top of the plasma dome 202 towards the baffle 210 (and towards the wafer 214), the gas may flow from the baffle 210 towards the top of the plasma dome 202 (and away from the wafer 214). In some such implementations, the first process gas and the baffle gas may be provided from the same source. For example, a first process gas source may be connected to the inlet port or ports of one or more three-way valves. The first process gas inlet(s) may, in turn be connected to one outlet port or ports of the three-way valves, and the baffle gas inlet(s) may be connected to the other outlet port or ports of the three-way valves. In this manner, the three-way valves may serve as a toggle that controls the directionality of gas flow within the remote volume 268. In some such reverse-flow implementations, the mass flow controller 238 in the vacuum port 206 may be opened to facilitate the reverse gas flow.

It is to be understood that several of the features shown in FIGS. 2A through 2F, e.g., the faceplate, first gas distribution holes, second gas distribution holes, may also be used in the context of a radical source having the appearance of a conventional showerhead. For example, in some implementations, the plasma dome 202 may not be present, e.g., when the radicals are provided by an external plasma generator unit, such as an ASTRONi™ reactive gas generator, provided by MKS Instruments. In such implementations, a simple cover may be affixed to the dual-flow faceplate 208 to form such a plenum volume that is partitioned by the baffle into the baffle volume and the remote volume, and the external plasma source may be fluidly connected with the remote volume portion of the plenum volume via a port or other inlet through the cover or other boundary of the remote volume. Alternatively, radicals may be produced using any of a variety of other plasma sources, e.g., planar plasma sources, microwave plasma sources, etc. Regardless of the plasma source used, a remote volume may be used to contain the radicalized first process gas within the showerhead. Such a faceplate/cover unit may generally appear similar, at least to outward appearances, to conventional showerheads used in semiconductor fabrication applications. Such implementations are also considered to be within the scope of this disclosure.

Figure 2G:
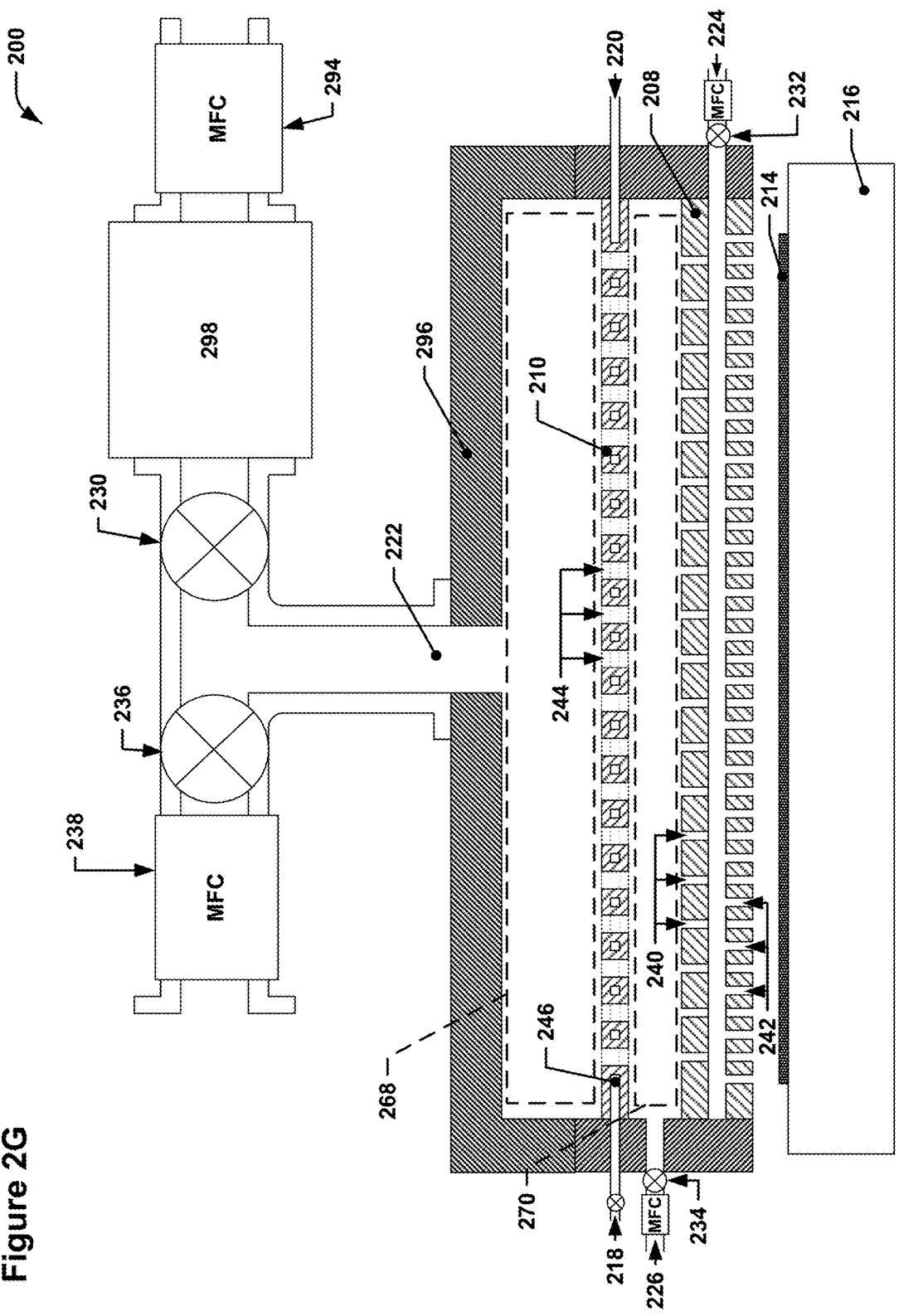
FIG. 2G depicts a conceptual example of a radical source including a conventional showerhead featuring an external remote plasma source coupled with a showerhead cover.

For clarity, FIG. 2G depicts a conceptual example of a radical source including a conventional showerhead featuring an external remote plasma source coupled with a showerhead cover. Many of the structures are similar to structures shown in FIGS. 2A through 2E, and are numbered alike. One immediately apparent difference is that the radical source 200 of FIG. 2G does not include plasma dome 202 and associated hardware. Instead, the radical source 200 of FIG. 2G features a conventional showerhead formed by coupling a cover 296 with the dual-flow faceplate 208. The cover 296 features a first process gas inlet 222, a vacuum port valve 236, and a first process gas inlet mass flow controller 238. The first process gas inlet 222 may be fluidly connected to an external remote plasma generator 298 such that radicalized first process gas supplied by the external remote plasma generator 298 is communicated to the remote volume 268 formed between the cover 296 and the baffle 210. The vacuum port valve 236 may function in much the same manner as the vacuum port valve 236 in FIG. 2A. While the cover 296 is shown as a piece separate from the portion of the radical source 200 that interfaces with the baffle 210 and the dual flow faceplate 208, the cover 296 may be integrated with this portion instead. Additionally, alternative flow paths for the first process gas inlet 222 may be used as well in order to provide more efficient radical delivery to the remote volume 268. In some implementations, the cover 296 may be replaced by or include an electrode and the electrode may be used to generate a plasma within the remote volume 268 using the first process gas. In such implementations, the electrode may be a flat plate electrode and the first process gas may, for example, be fed into the remote volume 268 from one or more ports in the side of the remote volume 268.Generally speaking, the baffle configurations shown and discussed herein may be used with a wide variety of remote plasma sources. Other implementations using these other types of remote plasma sources are to be understood to be within the scope of this disclosure as well. At a high level, any remote plasma source may be equipped with a baffle system and baffle gas flow hardware as discussed above between the plasma source and the faceplate and at least be within the scope of this disclosure.

Figure 3A:
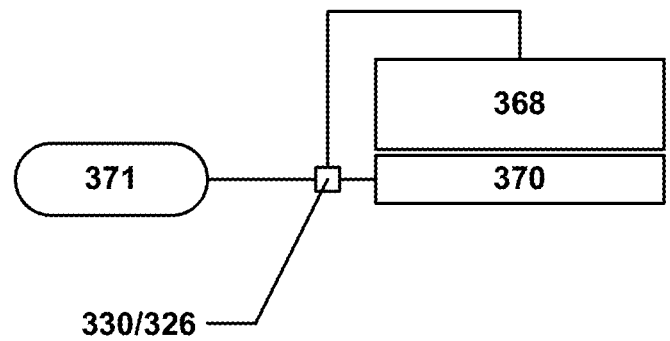
FIG. 3A shows a partial schematic of a radical source configured to divert initial first process gas flow from the remote volume to the baffle volume.

FIG. 3A shows a partial schematic of a radical source configured to divert initial first process gas flow from the remote volume to the baffle volume. As can be seen, a first process gas source 371 may be connected to a remote volume 368 and a baffle volume 370 by two separate gas lines that meet at a first process gas inlet valve 330/baffle gas inlet valve 326. This combination valve may, for example, be a three-way valve or may be several on/off valves arranged to allow for first process gas to be flowed into either gas line. In this configuration, the first process gas and the baffle gas may be substantially the same gas.

Figure 3B:
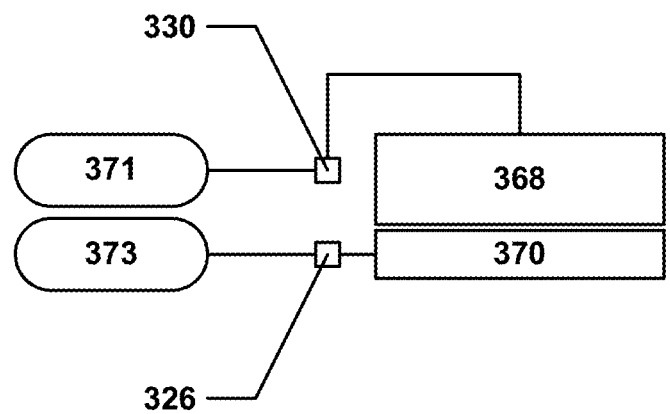
FIG. 3B shows a partial schematic of a radical source configured to have separate first process gas and baffle gas sources.

FIG. 3B shows a partial schematic of a radical source configured to have separate first process gas and baffle gas sources. In this implementation, a separate baffle gas source 373 may be provided and may be connected to the baffle volume 370 via a gas line controlled by the baffle gas inlet valve 326. The first process gas source 371 may be connected to the remote volume 368 by a gas line controlled by the first process gas inlet valve 330. This implementation allows for the baffle gas to be different from the first process gas.

Some other implementations may provide a blend of the features shown in FIGS. 3A and 3B. For example, the baffle gas and the first process gas may each be provided by different sources, but valving arrangements may be implemented that allow the two gas sources to mix. Thus, for example, a carrier gas such as argon may be added to the first process gas and the mixed gas may then be flowed into the baffle volume 370. During non-baffle flow operations, the argon source may be turned off and only the first process gas may be flowed into the remote volume 368.

While FIGS. 2A through 2G depict various high-level examples of a baffle-equipped, radical source, a more detailed example of such a radical source is explored with reference to the following Figures.

Figure 4A:
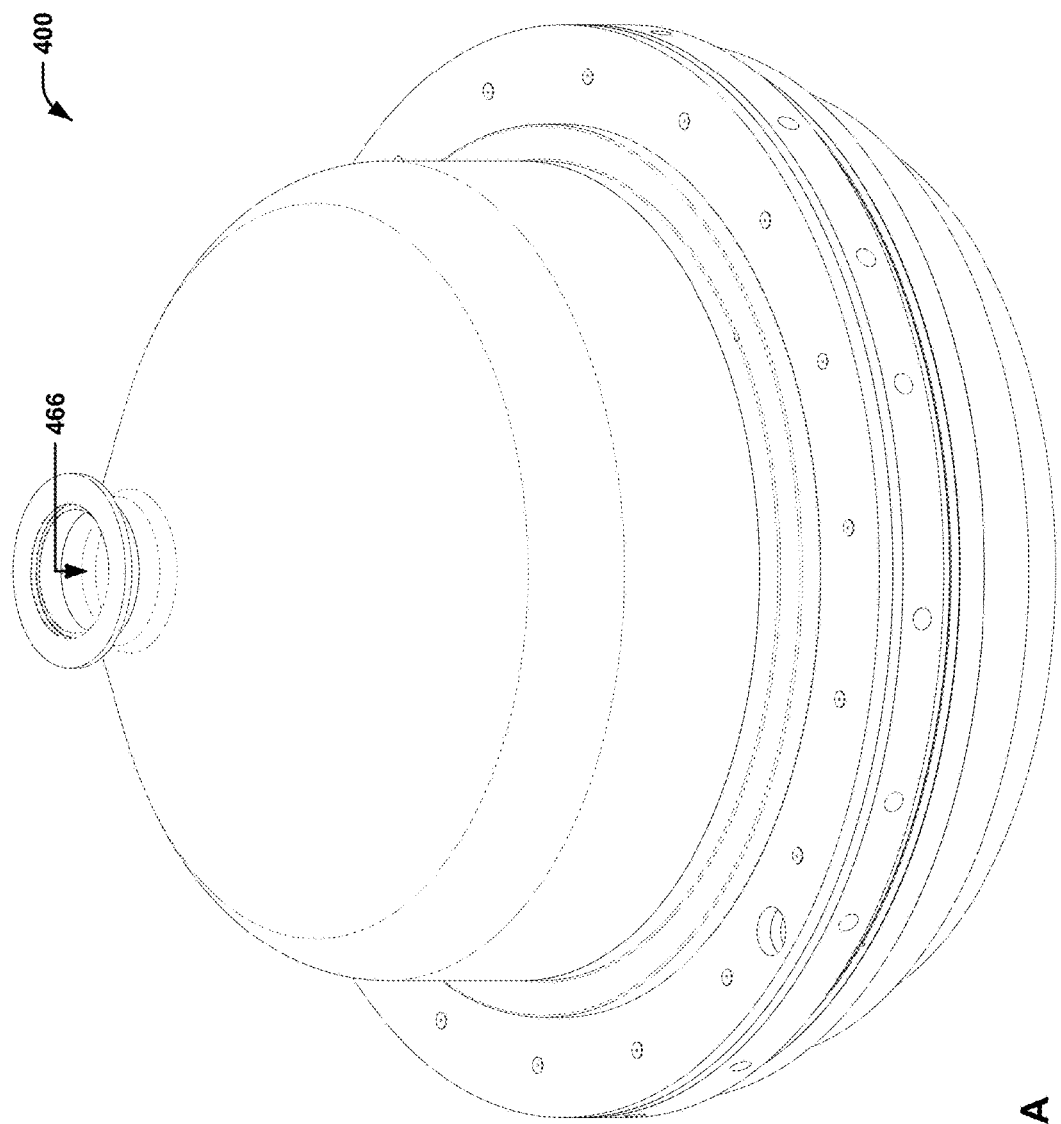
FIG. 4A depicts an isometric view of an example of a radical source.

FIG. 4A depicts an isometric view of an example of a radical source. A radical source 400 is shown featuring a plasma dome 402 and an orifice 466, e.g., such as the first process gas inlet described earlier, in the top of the plasma dome 402. Further details may be visible in FIG. 4B, which depicts an isometric sectional view of the example of the radical source of FIG. 4A. RF coils are not depicted in FIGS. 4A-4J, although such equipment or other plasma-generating devices may be located in close proximity to the plasma dome 402.

The radical source 400 may include a baffle 410 that is formed from two pieces: a baffle top portion 448 and a baffle bottom portion 450. Such a two-piece construction may allow for internal features, e.g., cooling channels 446, to be incorporated inside of the baffle 410. For example, in FIG. 4B, the cooling channels 446 are recessed into the surface of the baffle bottom portion 448 that interfaces with the baffle top portion 450. In such implementations, the baffle top portion 448 and the baffle bottom portion 450 may be bonded, e.g., via brazing, or otherwise joined together to form a substantially sealed unit that provides discrete coolant inlets and outlets for such internal cooling channels 446. The baffle 410 may have a number of baffle holes 444 extending through itself. In implementations where the baffle 410 is not cooled, the two-piece construction discussed above may be replaced with a simpler, single-piece construction, e.g., a plate with the baffle holes 444 extending through it.

The radical source 400 may also include a dual-flow faceplate 408 that is similarly formed from two pieces: a faceplate top portion 462 and a faceplate bottom portion 464. The faceplate bottom portion 464 may include both first gas distribution holes 440 and second gas distribution holes 442, as well as internal gas distribution channels 482 configured to route gas from second process gas inlets to the second gas distribution holes 442. The faceplate top portion 462 may also include the first gas distribution holes 440, and may also include matching gas distribution channels 482 that, when the faceplate top portion 462 and the faceplate bottom portion 464 are mated together, combine with the gas distribution channels 482 on the faceplate bottom portion 464 to form a single set of internal gas distribution channels 482 extending into both the faceplate top portion 462 and the faceplate bottom portion 464.

In some implementations, the faceplate or dual-flow faceplate may also feature internal cooling channels through which fluid may be flowed in order to cool or heat the faceplate. The cooling channels may be sealed from the gas flow paths and process volumes of the radical source and processing apparatus to avoid contamination of the process environment by the fluid. The cooling channels may allow the faceplate to be temperature-controlled so as to enhance process efficiency.

Figure 4B:
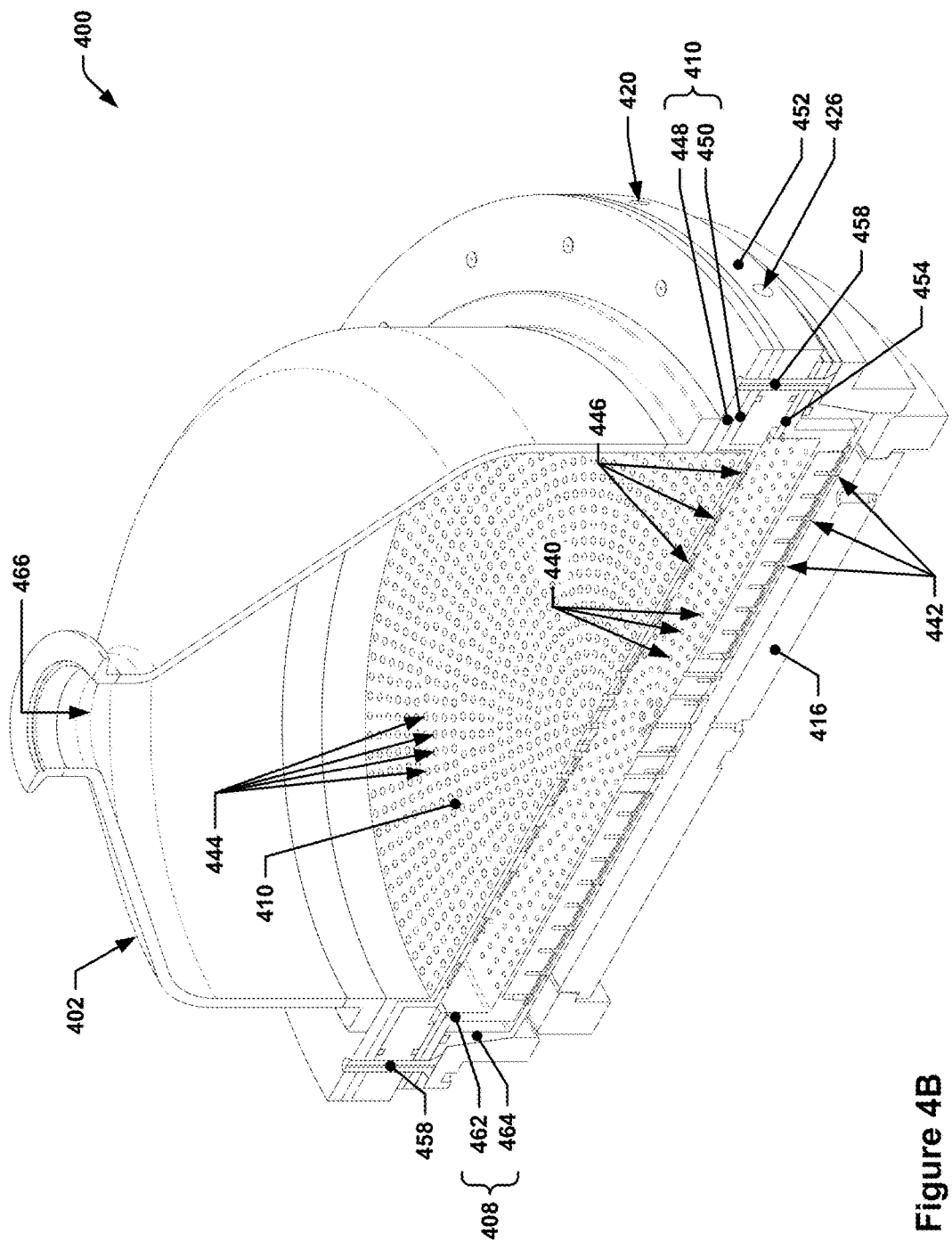
FIG. 4B depicts an isometric sectional view of the example of the radical source of FIG. 4A.

As can be seen in FIG. 4B, the first gas distribution holes 440 and the baffle holes 444 are arranged in substantially the same pattern and are present in equal numbers. The baffle holes 244 are larger than the first gas distribution holes 440 in diameter, however, and the flow conductivity through the baffle 410 is thus correspondingly greater than the flow conductivity through the dual-flow faceplate 408. In other implementations, the baffle holes 444 may be arranged in a different pattern and/or present in a different amount from the first gas distribution holes 440.

The radical source 400 may also include an adapter ring 452. The adapter ring 452 may include various features such as threaded interfaces for receiving fittings for connection to process gas sources, coolant systems, etc. A gasket plate 454 may, if needed, be used to provide additional sealing surfaces between various components in the radical source 400. The various components shown in FIG. 4B may be held together, for example, by fasteners 458. The radical source 400 may be centered over a wafer support 416, although the wafer support 416 is to be understood to be separate from the radical source 400.

Figure 4C:
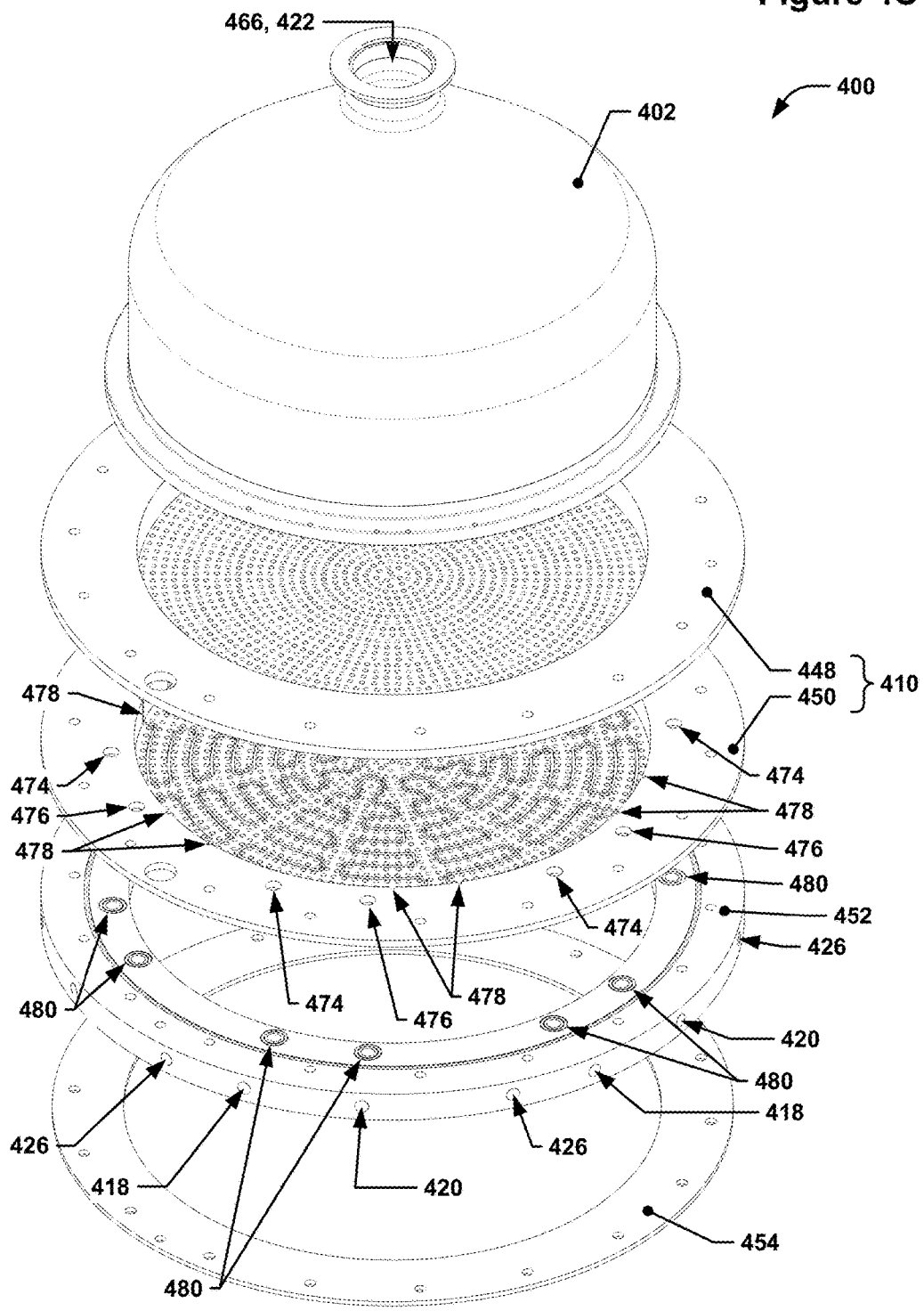
FIG. 4C depicts an isometric exploded view of the gasket plate and components above the gasket plate of the example of the radical source of FIG. 4A.
Figure 4D:
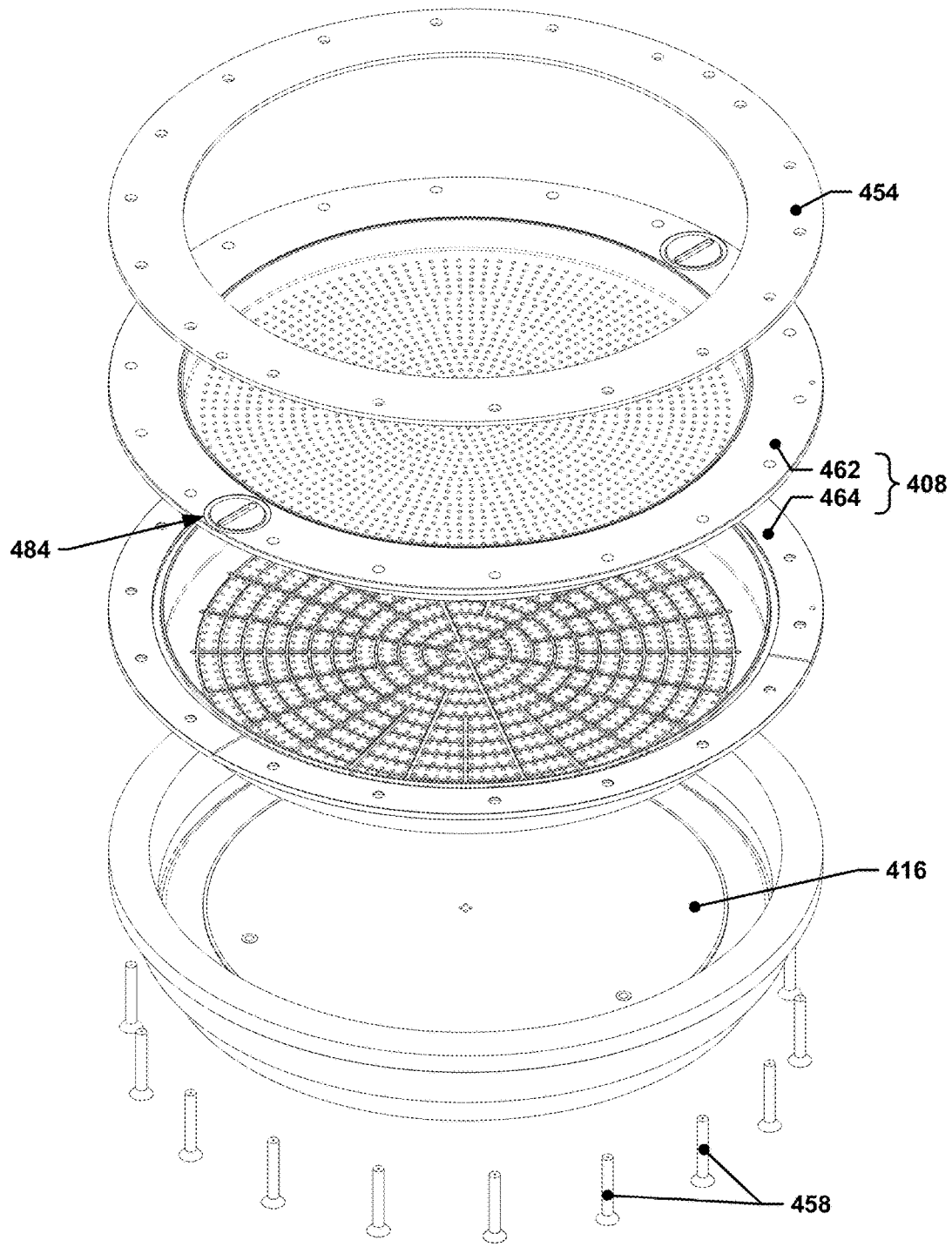
FIG. 4D depicts an isometric exploded view of the gasket plate and components below the gasket plate of the example of the radical source of FIG. 4A.
Figure 4F:
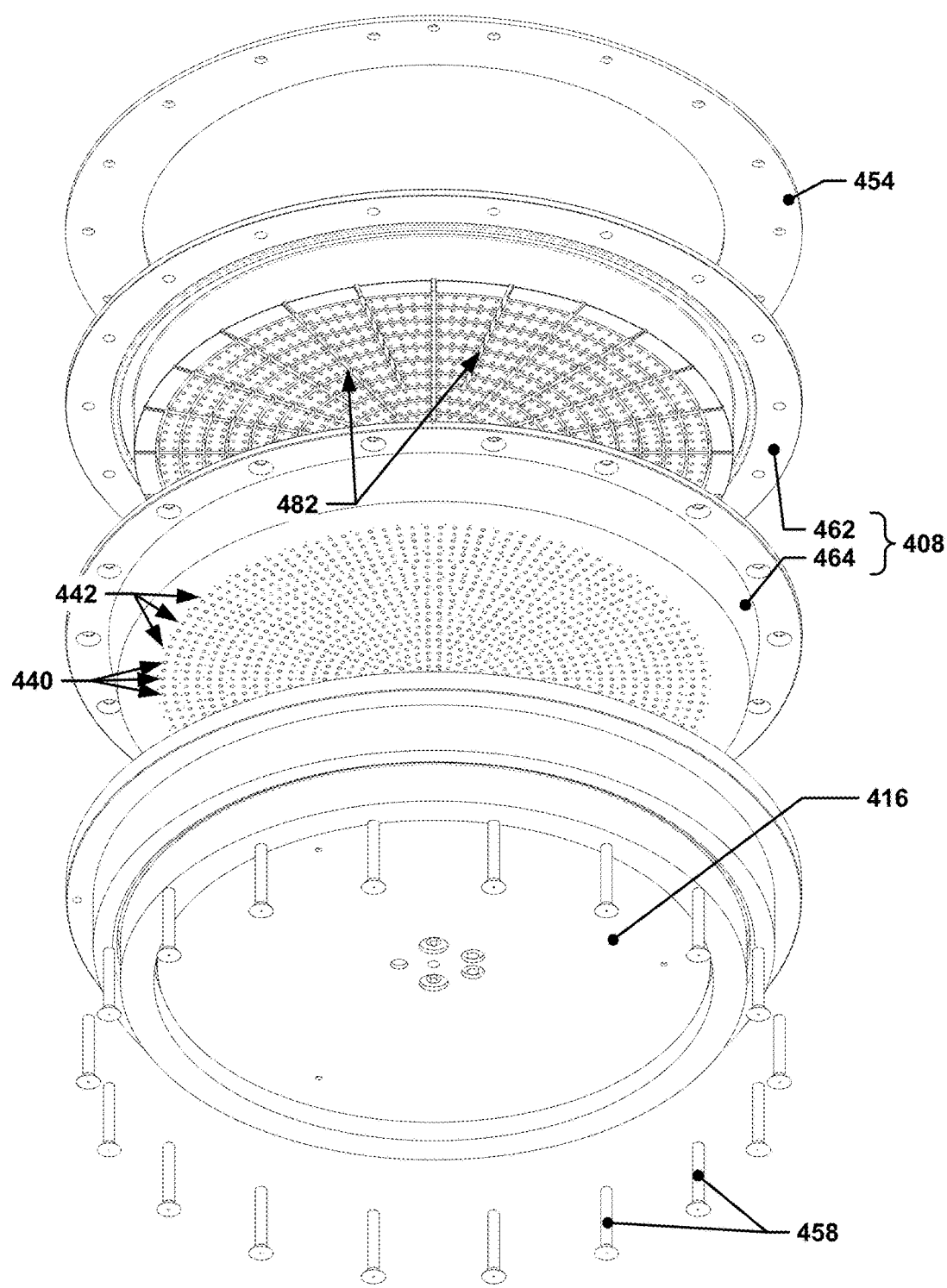
FIG. 4F depicts a reverse isometric exploded view of the gasket plate and components above the gasket plate of the example of the radical source of FIG. 4A.

FIG. 4C depicts an isometric exploded view of the gasket plate and components above the gasket plate of the example of the radical source of FIG. 4A. FIG. 4D depicts an isometric exploded view of the gasket plate and components below the gasket plate of the example of the radical source of FIG. 4A. FIG. 4E depicts a reverse isometric exploded view of the gasket plate and components above the gasket plate of the example of the radical source of FIG. 4A. FIG. 4F depicts a reverse isometric exploded view of the gasket plate and components above the gasket plate of the example of the radical source of FIG. 4A.

As can be seen, the baffle top portion 448 and the baffle bottom portion 450 may both have the form of flanged circular plates that nest together. Other geometries are possible as well depending on design and packaging requirements. In the depicted implementation, coolant may be fed into the baffle 410 through coolant inlets 418 in adapter ring 452. The coolant inlets 418 may exit the adapter ring 452 via coolant transfer ports 480, which may be interfaced with coolant inlet ports 474 in the baffle bottom portion 450. The coolant inlet ports 474 may feed into cooling feed channels 456 recessed into the flange of the baffle top portion 448 (see reverse isometric exploded views) and route coolant to coolant risers 478 that may be used to feed coolant into the cooling channels 446 in the baffle bottom portion 450. Other coolant risers 478 may be fluidly connected with the exits of the serpentine cooling passages 446 and pass the coolant through coolant outlet ports 476 and mating coolant transfer ports 480 to coolant outlets 420. Other cooling arrangements are possible as well, e.g., different cooling passage geometries/routing. As noted previously, some implementations may not feature a cooled baffle and the various features associated with baffle cooling may be omitted in such implementations.

The adapter ring may also feature one or more baffle gas inlets 426 that are configured to allow for the introduction of a baffle gas into the baffle volume bounded by the baffle 410 and the dual-flow faceplate 408. In this implementation, six baffle gas inlets 426 equally spaced about the adapter ring 452 are used to provide baffle gas to the baffle volume via radial baffle gas outlets 472.

The gasket plate 454 may serve as an intermediate sealing surface for the various gas routing passages that are present in the radical source 400. In some implementations, depending on how such routing is performed, the gasket plate 454 may be unnecessary and be omitted.

As noted, the dual-flow faceplate 408 may be constructed in a somewhat similar manner to the baffle 410 (with cooling). For example, the dual-flow faceplate 408 may be formed from a faceplate top portion 462 and a faceplate bottom portion 464. The faceplate top portion 462 and the faceplate bottom portion 464 may, as shown, have the overall shape of a set of nested flanged plates, although other geometries are also considered within the scope of this disclosure. One or both of the faceplate top portion 462 and the faceplate bottom portion 464 may feature gas distribution channels 482, in this case forming a network of radial and circumferential passages, traversing mating surfaces of the faceplate top portion 462 and the faceplate bottom portion 464. The first gas distribution holes 440 may travel through both the faceplate top portion 462 and the faceplate bottom portion 464, whereas the second gas distribution holes 442 may travel only through the faceplate bottom portion 464 and link up with the gas distribution channels 482. Second process gas transfer ports 484 may allow for the second process gas to be routed to the gas distribution channels 482 without mixing with the first process gas or the baffle gas within the radical source.

Figure 4G:
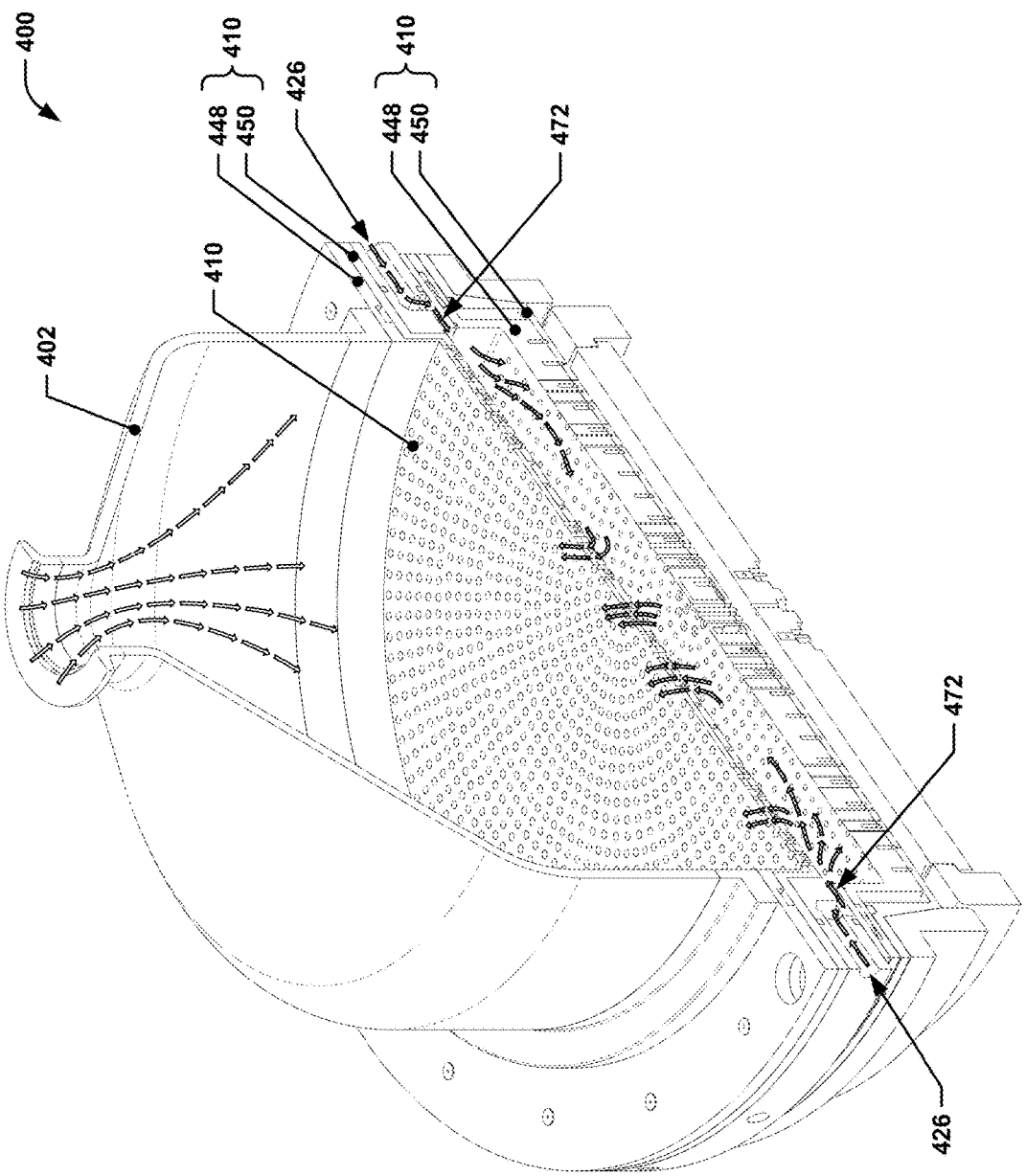
FIG. 4G depicts an isometric sectional view of the example of the radical source of FIG. 4A with the section plane passing through two baffle gas inlets.

FIG. 4G depicts an isometric sectional view of the example of the radical source of FIG. 4A with the section plane passing through two baffle gas inlets. White arrows indicate the flow of a first process gas into the top of the plasma dome 402 and towards the dual-flow faceplate 408. RF coils (not shown) may be used to generate a radical-generating plasma using the first process gas within the plasma dome 402. At the same time, baffle gas is introduced into the baffle volume via the baffle gas inlets 426 and the baffle gas outlets 472. The baffle gas may flow into the baffle volume and then flow primarily into the remote volume via the baffle holes 444. While some baffle gas may also flow towards the wafer support 416 via the first gas distribution holes 440, due to the reduced flow conductivity of the first gas distribution holes 440 as compared with the baffle holes 444, the amount of baffle gas flow towards the wafer support 416 may be considerably less than the amount of baffle gas flow towards the plasma dome 402. The flow of baffle gas towards the plasma dome 402 may substantially prevent radicals produced by the plasma formed within the plasma dome 402 from diffusing towards the wafer support 416.

Figure 4H:
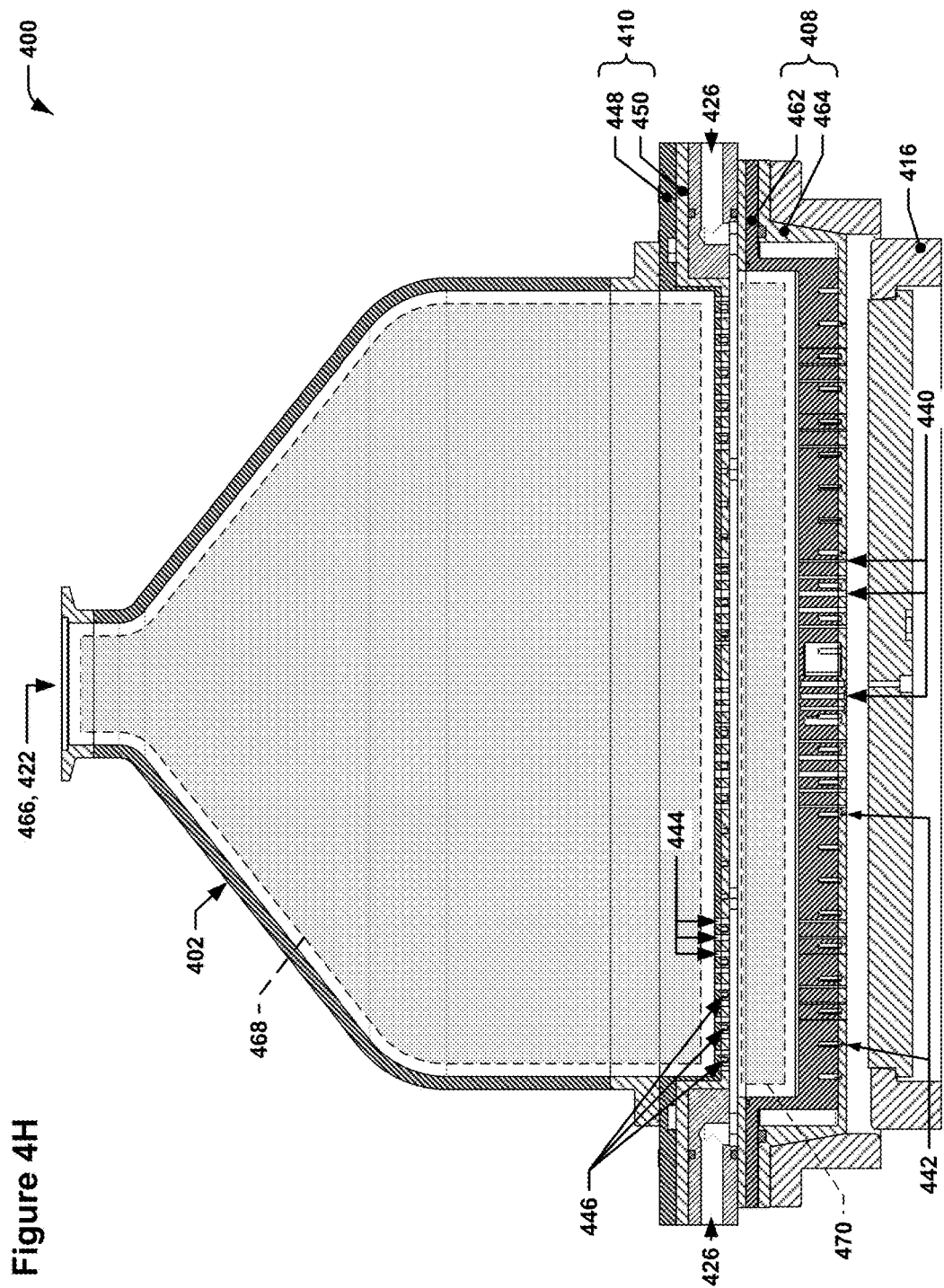
FIG. 4H depicts a side view of the section shown in FIG. 4E.

FIG. 4H depicts a side view of the section shown in FIG. 4E. Also shown in FIG. 4H are the remote volume 468 and the baffle volume 470. The depth of the baffle volume 470 may be more or less than that shown. Typically, the depth of the baffle volume 470 may be sufficiently deep to allow for good radial flow towards the center of the baffle 410 while avoiding an undesirably large baffle volume 470. Too shallow a baffle volume 470 depth may constrain baffle gas flow in the radial direction and result in a pressure differential between the baffle gas passing through the baffle holes 444 at the center of the baffle 410 and the baffle gas passing through the baffle holes 444 near the perimeter of the baffle 410 that may be high enough that the pressure differential causes undesired levels of process non-uniformity across the wafer. This may reduce the effectiveness of the baffle gas in preventing radicals from the plasma dome 402 from passing through the center of the baffle 410. Too large a baffle volume may increase the amount of time it takes to fill the baffle volume 470 with baffle gas and increase the cycle time of baffle gas operations, which may reduce tool productivity.

Figure 4I:
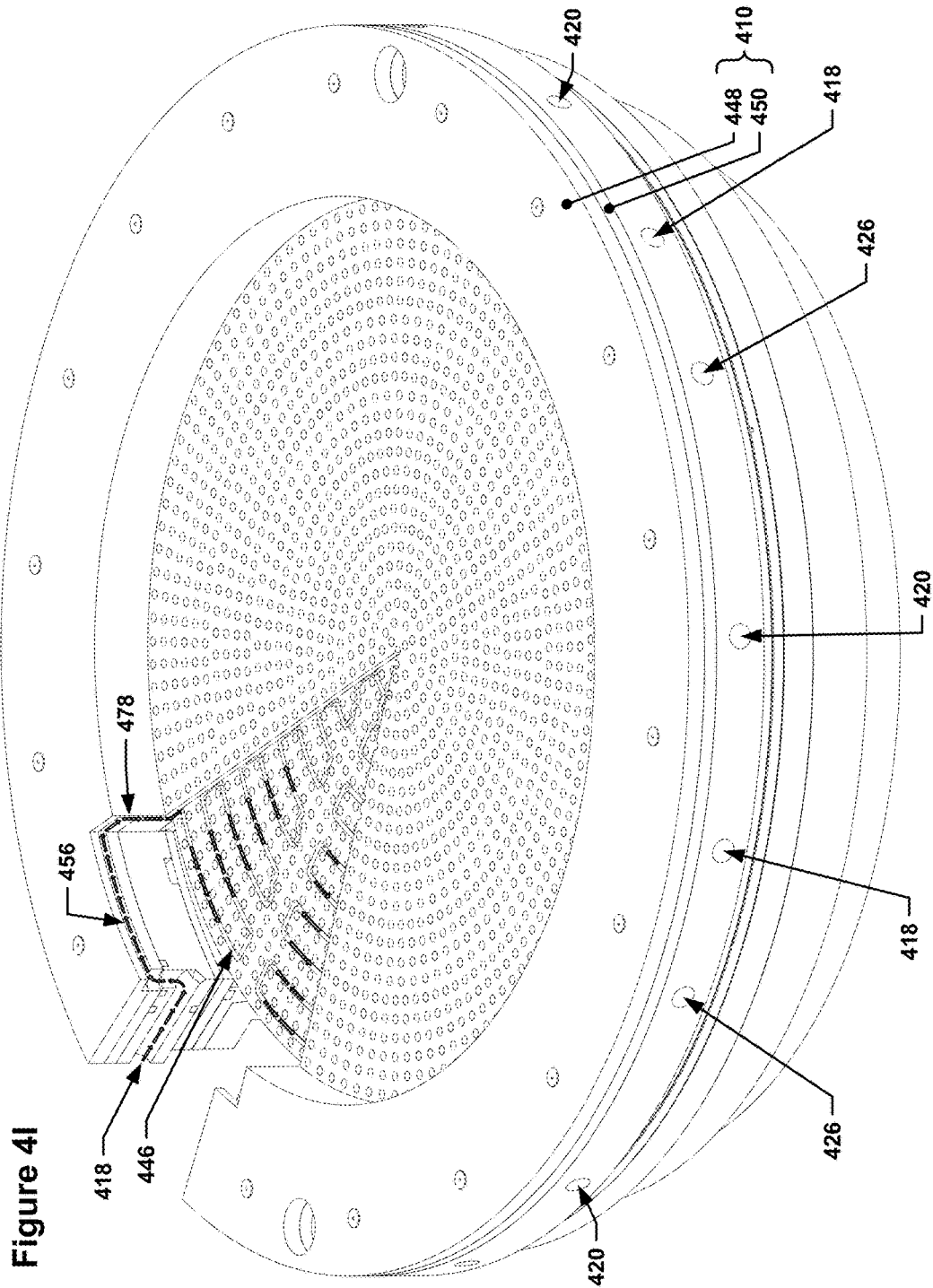
FIG. 4I depicts an off-angle partial cutaway of a portion of the radical source of FIG. 4A.
Figure 4J:
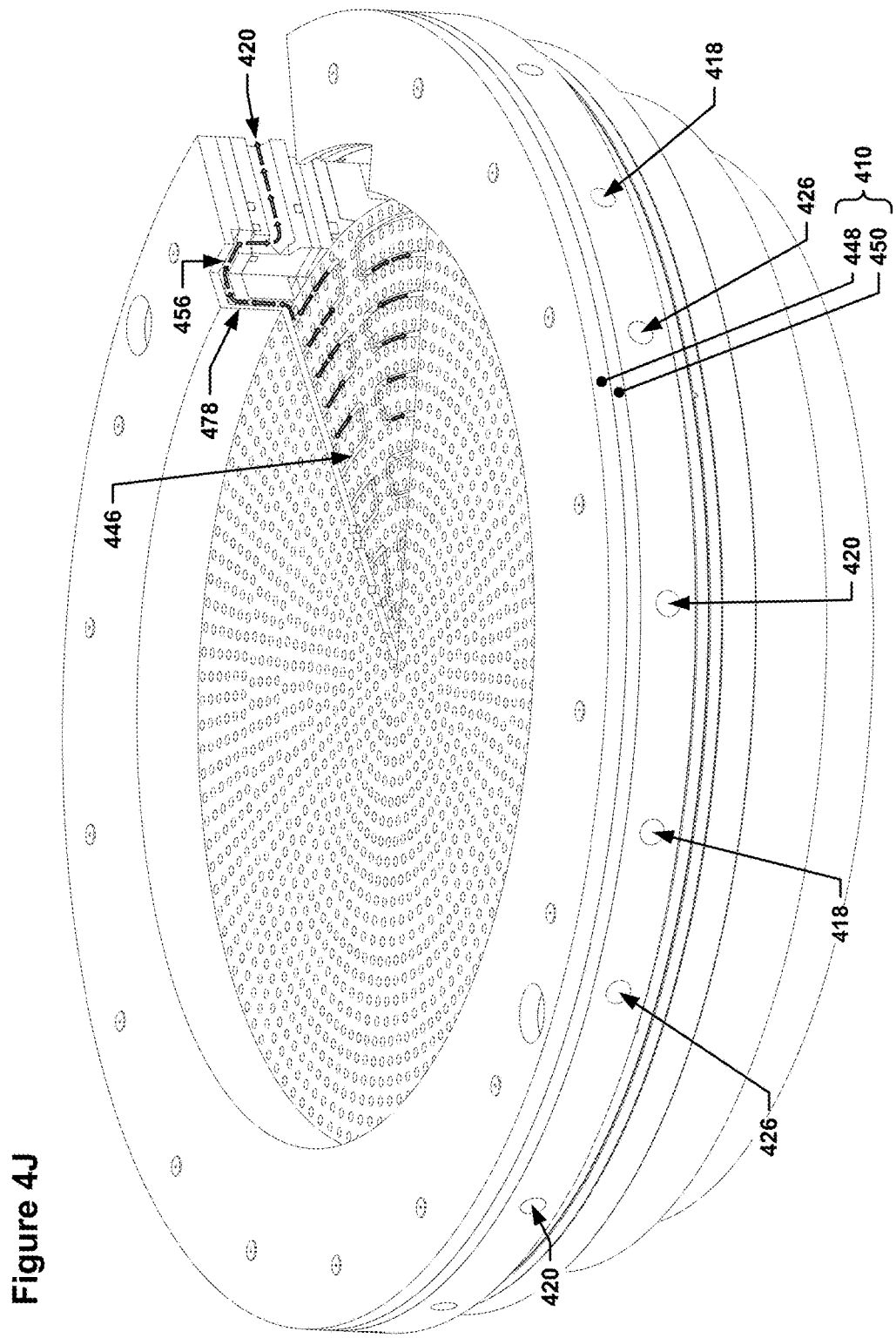
FIG. 4J depicts an off-angle partial cutaway of a portion of the radical source of FIG. 4A from a different angle.

FIG. 4I depicts an off-angle partial cutaway of a portion of the radical source of FIG. 4A. FIG. 4J depicts an off-angle partial cutaway of a portion of the radical source of FIG. 4A from a different angle. As can be seen in FIGS. 4I and 4J, coolant (grey arrows) may pass through a coolant inlet 418, along a coolant feed channel 456, down a coolant riser 478, through a serpentine cooling passage, up another coolant riser 478 and through another coolant feed channel 456, and out a coolant outlet 420. Such an arrangement may be repeated in a radial pattern about the baffle 410.

It is to be understood that while the above discussion regarding radical sources has been in the context of RPALD processes, such equipment may also be of use in any semiconductor fabrication process involving remote plasma generation and radical flows and precursor gas flows that are preferably kept separated in time and space. For example, such equipment may be used in an atomic layer etch (ALE)-type process where conformal layers of material are etched away using alternating applications of radicals and one or more precursor(s). In general, references to an atomic layer process are to be understood to refer to any conformal process that involves atomic layering, whether it be atomic layer deposition, atomic layer etch, or some other process with similar fundamental characteristics.

Figure 5:
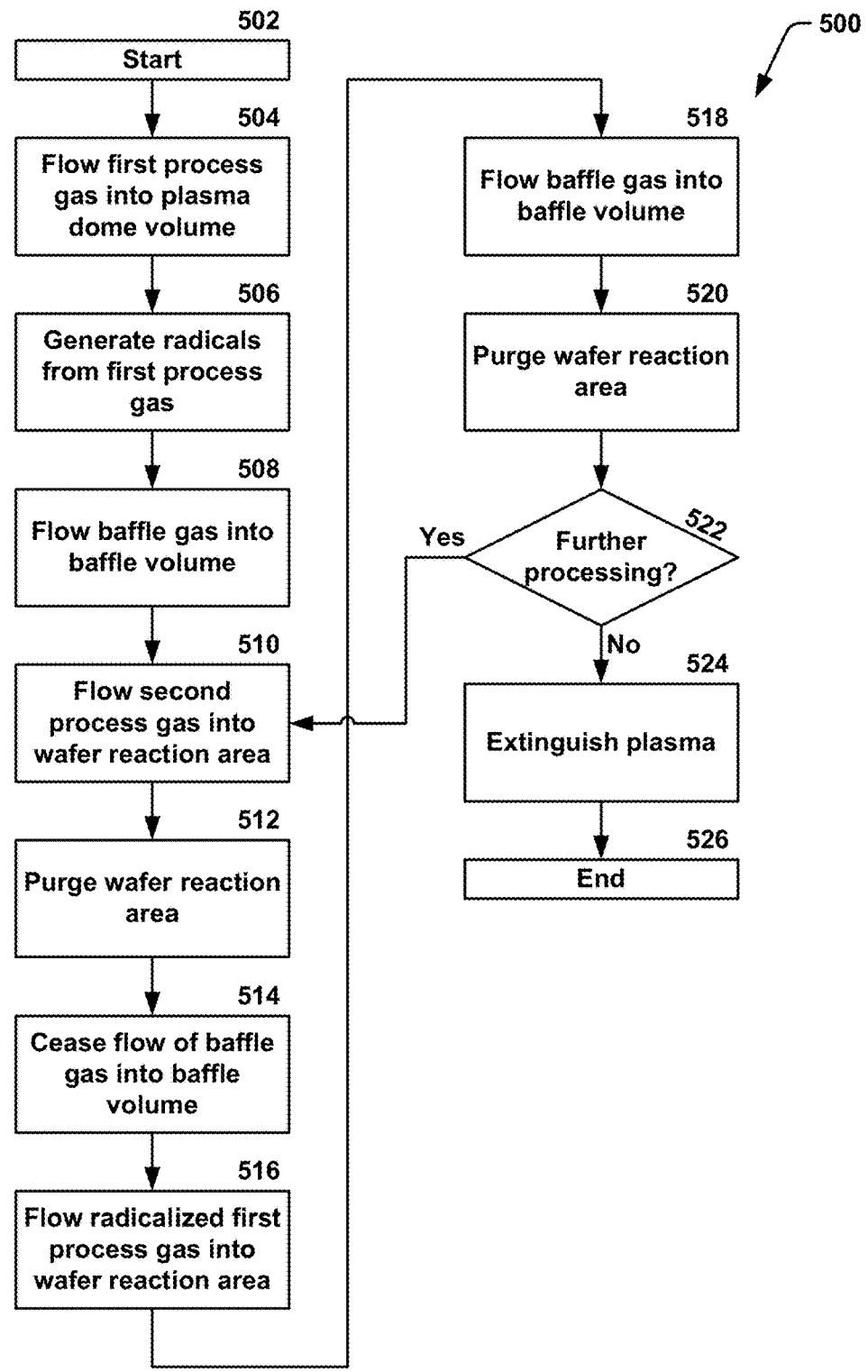
FIG. 5 depicts a flow diagram showing one technique for using a radical source as described herein.

FIG. 5 depicts a flow diagram showing one technique for using a radical source as described herein. In block 502, a technique 500 begins. It is to be understood that various semiconductor fabrication techniques may incorporate the technique 500, and that such fabrication techniques may include additional steps prior to block 502. In block 504, a first process gas is flowed into a remote volume such as the remote volume described previously. In block 506, a plasma may be generated by, for example, energizing the RF coils positioned about the remote volume. Alternatively, the first process gas may be radicalized, i.e., radicals may be generated using the first process gas. This may occur within the remote volume, or the radicalized first process gas may be supplied to the remote volume from an external source, e.g., an external remote plasma generator.

In block 508, a baffle gas may be flowed into a baffle volume such as the baffle volume described earlier in this disclosure. In some implementations, the baffle gas may be the same as the first process gas, and may also serve as the first process gas flow of block 504. The baffle gas flow may act to keep the radicalized first process gas from escaping the remote volume and flowing through a faceplate such as the faceplates described earlier in this disclosure. In block 510, a second process gas may be flowed from the faceplate, into a wafer reaction area, and deposited on a semiconductor wafer or substrate. After sufficient deposition has occurred, the second process gas flow may be stopped, and a purge of the wafer reaction area begun in block 512.

After the purge operation of block 512 is complete, the baffle gas flow into the baffle volume may be stopped in block 514, allowing radicalized first process gas from the remote volume to flow into the wafer reaction area via first gas distribution holes in the faceplate in block 516. When sufficient radicalized first process gas has been provided to the wafer reaction area and sufficient reaction time has elapsed, the baffle gas flow into the baffle volume may be re-started in block 518, curtailing further radicalized first process gas flow from the remote volume into the wafer reaction area. A further purge operation may be performed in block 520 to clear unreacted radicalized first process gas from the wafer reaction area. In block 522, a decision may be made as to whether further ALD cycles are needed. If so, the technique may return to block 510. If not, the technique may continue to block 524, where the plasma may be extinguished. The technique may end in block 526. It is to be understood that, depending on the particular fabrication process within which technique 500 is performed, additional steps may be performed after block 526, or in between any of the blocks shown.

In block 514, the flow of the first process gas into the remote volume may be stopped. Block 514 is optional and may, in some cases, be omitted. For example, if the baffle gas is of sufficiently similar composition to the first process gas, the first process gas may be stopped and the plasma may be fed with the baffle gas. However, if the baffle gas is not sufficiently similar in composition to the first process gas to keep the plasma lit, then the first process gas may continue to be supplied to the remote volume.

In block 516, gas may be evacuated from the remote volume via a pumping port. This may be done to prevent over-pressurization of the plasma dome. Such evacuation may be unnecessary if the pressure environment within the remote volume stays within acceptable bounds. Accordingly, block 516 may be optional in some implementations.

In block 518, the flow of baffle gas into the remote volume is stopped. This may allow the first process gas and radicals within the remote volume to continue to flow towards the wafer. If the first process gas has been turned off in block 514, the flow of first process gas may be restarted in optional block 520. The purge cycle may end in block 522.

In block 524, a determination may be made as to whether further processing involving the remotely-generated plasma is warranted. If so, the technique may return to block 508. If not, the technique may proceed to block 526, where the plasma may be extinguished. The technique may end in block 528, although it is to be recognized that various other steps or actions may be performed after block 528 depending on the semiconductor fabrication process used.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., wafer, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Another aspect of the invention is an apparatus configured to accomplish the methods described herein. A suitable apparatus includes hardware for accomplishing the process operations and a system controller having instructions for controlling process operations in accordance with the present invention. The system controller may be configured, for example, to operate valves controlling the flow of first process gases, second process gases, and baffle gases into the radical sources described herein. The system controller may also be configured to control flow of coolant through the baffle, and to control the operation of the RF generator hardware. The system controller may receive data from one or more sensors, e.g., temperature sensors, pressure sensors, etc., in order to control the radical source in accordance with semiconductor process requirements. The system controller will typically include one or more memory devices and one or more processors configured to execute the instructions so that the apparatus will perform a method in accordance with the present invention. Machine-readable media containing instructions for controlling process operations in accordance with the present invention may be communicatively coupled to the system controller.

Any of the above implementations may be used alone or together with one another in any combination. Although various implementations may have been motivated by various deficiencies with the prior art, which may be discussed or alluded to in one or more places in the specification, the implementations do not necessarily address any of these deficiencies. In other words, different implementations may address different deficiencies that may be discussed in the specification. Some implementations may only partially address some deficiencies or just one deficiency that may be discussed in the specification, and some implementations may not address any of these deficiencies.

While various implementations have been described herein, it should be understood that they have been presented by way of example only, and not limitation. Thus, the breadth and scope of the present disclosure should not be limited by any of the implementations described herein, but should be defined only in accordance with the following and later-submitted claims and their equivalents.

It will be understood that unless features in any of the above-described implementations are expressly identified as incompatible with one another or the surrounding context implies that they are mutually exclusive and not readily combinable in a complementary and/or supportive sense, the totality of this disclosure contemplates and envisions that specific features of those implementations can be selectively combined to provide one or more comprehensive, but slightly different, technical solutions. It will therefore be further appreciated that the above description has been given by way of example only and that modifications in detail may be made within the scope of the disclosure.

What is claimed is:

1. A radical source for semiconductor processes, the radical source comprising:
    a faceplate including a first plurality of gas distribution holes passing through the faceplate and exiting the radical source, the first plurality of gas distribution holes having a first total cross-sectional area;
    a first plenum volume, the first plenum volume partially bounded by the faceplate;
    a baffle having a first side and a second side opposing the first side, wherein:
        the baffle is offset from the faceplate with the first side facing the faceplate and in a direction nominally perpendicular to the faceplate,
        the baffle divides the first plenum volume into a baffle volume located between the first side of the baffle and the faceplate and a remote volume partially bounded by the second side of the baffle, and the baffle includes a plurality of baffle holes fluidly connecting the baffle volume and the remote volume, the baffle holes having a total cross-sectional area that is greater than the first total cross-sectional area;

one or more baffle gas inlets configured to flow baffle gas into the baffle volume without first flowing the baffle gas through the remote volume or the first gas distribution holes; and one or more first process gas inlets, the one or more first process gas inlets configured to flow a first process gas into the remote volume.

2. The radical source of claim 1, wherein:

the first plurality of gas distribution holes has a first total flow conductivity, and the plurality of baffle holes has a total flow conductivity that is greater than the first total flow conductivity.

3. The radical source of claim 1, wherein the one or more first process gas inlets are configured to flow the first process gas into the remote volume without first exposing the first process gas to the baffle.

4. The radical source of claim 1, further comprising a remote plasma dome connected with the faceplate, wherein the remote volume is substantially defined by the baffle and the remote plasma dome.

5. The radical source of claim 4, further comprising a radio-frequency generator configured to ignite a plasma using the first process gas within the remote volume.

6. The radical source of claim 1, further comprising:

a cover connected with the faceplate, the cover including the one or more first process gas inlets; and an external remote plasma generator connected with the one or more first process gas inlets, wherein the external remote plasma generator is configured to supply radicalized first process gas to the remote volume via the one or more first process gas inlets.

7. The radical source of claim 1, further comprising:

an electrode plate connected with, and offset from, the baffle, wherein:

the remote volume is formed between the electrode plate and the baffle, and the electrode plate is configured to ignite a plasma within the remote volume using the first process gas.

8. The radical source of claim 1, wherein the faceplate is a dual-flow faceplate with a plurality of second gas distribution holes fluidly connected to a set of gas distribution channels within the faceplate, the gas distribution channels fluidly connected to one or more second process gas inlets and the second gas distribution holes exiting the faceplate on a side opposite the baffle.

9. The radical source of claim 1, wherein the baffle is made from quartz or is quartz-coated.

10. The radical source of claim 1, wherein the baffle volume is further bounded by one or more outer circumferential surfaces and the one or more baffle gas inlets are located along one or more of the outer circumferential surfaces.

11. The radical source of claim 1, wherein the radical source includes a plurality of baffle gas inlets arranged across a side of the faceplate facing the baffle, the baffle gas inlets fluidly connected to a set of baffle gas distribution channels within the faceplate and the baffle gas distribution channels configured to flow baffle gas into the baffle volume via the baffle gas inlets.

12. The radical source of claim 1, wherein the faceplate and the baffle are of substantially the same size.

13. The radical source of claim 1, wherein the baffle volume is an order of magnitude or more thinner in an axial direction than the remote volume is in the axial direction, the axial direction substantially perpendicular to the faceplate.

14. The radical source of claim 1, wherein the first gas distribution holes and the baffle holes are arranged in matching patterns and the baffle holes are larger than the first gas distribution holes.

15. The radical source of claim 1, wherein the first gas distribution holes and the baffle holes are arranged in non-matching patterns.

16. The radical source of claim 15, wherein the first gas distribution holes and the baffle holes do not overlap one another.

17. The radical source of claim 1, wherein the baffle is liquid-cooled.

18. The radical source of claim 17, wherein the baffle includes internal cooling passages that traverse the baffle and that do not intersect any of the baffle holes.

19. The radical source of claim 1, further comprising:

one or more baffle gas inlet pressure control valves configured to control baffle gas flow from the baffle gas inlets into the baffle volume; and a controller including a non-transitory memory device and one or more processors communicatively connected with the non-transitory memory device and the one or more baffle gas inlet pressure control valves, the non-transitory memory device storing computer-executable instructions for controlling the one or more processors to:

open the one or more baffle gas inlet pressure control valves during first operations of an atomic layer deposition (ALD) cycle performed with the radical source where radicalized first process gas is to be substantially prevented from flowing through the faceplate via the first gas distribution holes, substantially close the one or more baffle gas inlet pressure control valves during second operations of the ALD cycle, the second operations including flowing radicalized first process gas through the faceplate via the first gas distribution holes, and repeat the first operations and the second operations in an alternating manner.

20. The radical source of claim 19, wherein:

the faceplate is a dual-flow faceplate with a plurality of second gas distribution holes fluidly connected to a set of gas distribution channels within the faceplate, the gas distribution channels are fluidly connected to one or more second process gas inlets, the second gas distribution holes exit the faceplate on a side opposite the baffle, and the first operations include:

flowing a second process gas out of the faceplate via the second gas distribution holes, and performing purge operations between each successive first operation and second operation and between each successive second operation and first operation.

21. The radical source of claim 1, further comprising a pumping port fluidly connected to the remote volume such that the baffle volume is not interposed between the remote volume and the pumping port.

22. The radical source of claim 1, wherein the one or more first process gas inlets and the one or more baffle gas inlets are connected to the same gas source or separate sources of substantially the same gas.

23. The radical source of claim 22, wherein a three-way valve or other valve arrangement facilitating switchable gas delivery from a common source to one of two separate flow paths is used to connect the one or more first process gas inlets and the one or more baffle gas inlets to the gas source.

24. A radical source for semiconductor processes, the radical source comprising:
   a faceplate including a first plurality of gas distribution holes passing through the faceplate and exiting the radical source;
   a first plenum volume, the first plenum volume partially bounded by the faceplate;
   a baffle having a first side and a second side opposing the first side, wherein:
      the baffle is offset from the faceplate with the first side facing the faceplate and in a direction nominally perpendicular to the faceplate,
      the baffle divides the first plenum volume into a baffle volume located between the first side of the baffle and the faceplate and a remote volume partially bounded by the second side of the baffle, and
      the baffle includes a plurality of baffle holes fluidly connecting the baffle volume and the remote volume;
   one or more baffle gas inlets configured to flow baffle gas into the baffle volume without first flowing the baffle gas through the remote volume or the first gas distribution holes;
   one or more baffle gas inlet valves configured to control baffle gas flow from the baffle gas inlets into the baffle volume;
   one or more first process gas inlets, the one or more first process gas inlets configured to flow a first process gas into the remote volume; and
   a controller configured to:
      open the one or more baffle gas inlet valves during first operations of an atomic layer deposition (ALD) cycle performed with the radical source where radicalized first process gas from the remote volume is to be substantially prevented from flowing through the faceplate via the first gas distribution holes by the baffle gas,
      substantially close the one or more baffle gas inlet valves during second operations of the ALD cycle, the second operations including flowing radicalized first process gas through the faceplate via the first gas distribution holes, and
      repeat the first operations and the second operations in an alternating manner, wherein the baffle and the faceplate are configured so that the baffle gas flow from the baffle volume when the baffle gas inlet valves are open is biased towards the remote volume.

* * * * *